United States Patent
He et al.

(10) Patent No.: US 10,186,216 B2
(45) Date of Patent: Jan. 22, 2019

(54) GATE DRIVING CIRCUIT, DISPLAY PANEL AND DISPLAY APPARATUS HAVING THE SAME, AND DRIVING METHOD THEREOF

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventors: Xiaoxiang He, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 4 days.

(21) Appl. No.: 15/508,640

(22) PCT Filed: Oct. 31, 2016

(86) PCT No.: PCT/CN2016/104021
§ 371 (c)(1),
(2) Date: Mar. 3, 2017

(87) PCT Pub. No.: WO2017/181646
PCT Pub. Date: Oct. 26, 2017

(65) Prior Publication Data
US 2018/0166029 A1    Jun. 14, 2018

(30) Foreign Application Priority Data
Apr. 22, 2016  (CN) .......................... 2016 1 0258445

(51) Int. Cl.
*G09G 3/36* (2006.01)
*G02F 1/1343* (2006.01)
(Continued)

(52) U.S. Cl.
CPC ......... *G09G 3/3611* (2013.01); *G02F 1/1343* (2013.01); *G02F 1/136286* (2013.01);
(Continued)

(58) Field of Classification Search
CPC .......... G09G 3/3611; G09G 2310/0264; G02F 1/1343; G02F 1/136286; G06F 3/0416
See application file for complete search history.

(56) References Cited

U.S. PATENT DOCUMENTS 6,300,928 B1    10/2001  Kim
2013/0314343 A1 11/2013  Cho et al.
(Continued)

FOREIGN PATENT DOCUMENTS

CN    103943055 A    7/2014
CN    104821159 A    8/2015
(Continued)

OTHER PUBLICATIONS

First Office Action in the Chinese Patent Application No. 201610258445.9, dated Oct. 27, 2017; English translation attached.
(Continued)

*Primary Examiner* — Charles Hicks
(74) *Attorney, Agent, or Firm* — Intellectual Valley Law, P.C.

(57) ABSTRACT

The present application discloses a gate driver on array (GOA) circuit including a first GOA circuit; a second GOA circuit; and a voltage transmitting circuit configured to transmit an output voltage from the first GOA circuit to the second GOA circuit as an input voltage for the second GOA circuit; the output voltage from the first GOA circuit and the input voltage for the second GOA circuit having a substantially the same voltage level. An input port of the voltage transmitting circuit is connected to an output port of the first GOA circuit and configured to receive the output voltage
(Continued)

from the first GOA circuit; and an output port of the voltage transmitting circuit is connected to an input port of the second GOA circuit and configured to output a forwarded voltage to the second GOA circuit as the input voltage for the second GOA circuit.

20 Claims, 13 Drawing Sheets

(51) Int. Cl.
*G02F 1/1362* (2006.01)
*G06F 3/041* (2006.01)
*G11C 19/28* (2006.01)

(52) U.S. Cl.
CPC ............ *G06F 3/0416* (2013.01); *G09G 3/36* (2013.01); *G09G 3/3677* (2013.01); *G11C 19/28* (2013.01); *G09G 2310/0264* (2013.01); *G09G 2310/0286* (2013.01); *G09G 2320/0223* (2013.01)

(56) References Cited

U.S. PATENT DOCUMENTS

| | | | |
|---|---|---|---|
| 2016/0266700 A1* | 9/2016 | Ji | G06F 3/0412 |
| 2016/0274713 A1 | 9/2016 | Zhang et al. | |
| 2017/0123539 A1 | 5/2017 | Wang et al. | |
| 2017/0124976 A1 | 5/2017 | Chen | |
| 2017/0178584 A1 | 6/2017 | Ma et al. | |
| 2017/0178749 A1 | 6/2017 | Ma et al. | |

FOREIGN PATENT DOCUMENTS

| | | |
|---|---|---|
| CN | 104900211 A | 9/2015 |
| CN | 104916251 A | 9/2015 |
| CN | 105206218 A | 12/2015 |
| CN | 105206240 A | 12/2015 |
| CN | 105427824 A | 3/2016 |
| KR | 1020130131808 A | 12/2013 |

OTHER PUBLICATIONS

International Search Report & Written Opinion dated Dec. 28, 2016 regarding PCT/CN2016/104021.

* cited by examiner

GATE DRIVING CIRCUIT, DISPLAY PANEL AND DISPLAY APPARATUS HAVING THE SAME, AND DRIVING METHOD THEREOF

CROSS-REFERENCE TO RELATED APPLICATION

This application is a national stage application under 35 U.S.C. § 371 of International Application No. PCT/CN2016/104021, filed Oct. 31, 2016, which claims priority to Chinese Patent Application No. 201610258445.9, filed. Apr. 22, 2016, the contents of which are incorporated by reference in the entirety.

TECHNICAL FIELD

The present invention relates to a field of displaying, more particularly, to a gate drive circuit, a display panel and a display apparatus having the same, and driving method thereof.

BACKGROUND

Flat display panels have been widely used in various types of electronic devices including mobile phone, personal digital assistant, digital camera, or computer screen. In recent years, technologies that enable high density integration and low cost manufacture have become a focus of research and development. One of these important technologies is gate driver on array (GOA) circuit technology.

SUMMARY

In one aspect, the present invention provides a gate driver on array (GOA) circuit comprising a first GOA circuit; a second GOA circuit; and a voltage transmitting circuit configured to transmit an output voltage from the first GOA circuit to the second GOA circuit as an input voltage for the second GOA circuit; the output voltage from the first GOA circuit and the input voltage for the second GOA circuit having a substantially the same voltage level; wherein an input port of the voltage transmitting circuit is connected to an output port of the first GOA circuit and configured to receive the output voltage from the first GOA circuit; and an output port of the voltage transmitting circuit is connected to an input port of the second GOA circuit and configured to output a forwarded voltage to the second GOA circuit as the input voltage for the second GOA circuit.

Optionally, the first GOA circuit comprises A stages of first-GOA-sub-circuits, A being a positive integer greater than or equal to 1; each of the A stages of first-GOA sub-circuits having an input port and an output port, the output port of each of the A stages of first-GOA sub-circuits being connected respectively to a gate line of a same stage and an input port of a next adjacent-stage first-GOA sub-circuit, the input port of a first-stage first-GOA sub-circuit being connected to a start-cycle signal port, the output port of an Ath-stage first-GOA sub-circuit being connected to a gate line of a same stage; the second GOA circuit comprises B stages of second-GOA-sub-circuits, B being a positive integer greater than or equal to 1; each of the B stages of second-GOA sub-circuits having an input port and an output port, the output port of each of the B stages of second-GOA sub-circuits being connected respectively to a gate line of a same stage and an input port of a next adjacent-stage second-GOA sub-circuit, the output port of the Bth-stage second-GOA sub-circuit being connected to a gate line of a same stage; the voltage transmitting circuit is configured to transmit an output voltage from the Ath-stage first-GOA sub-circuit to the first-stage second-GOA sub-circuit as an input voltage for the first-stage second-GOA sub-circuit; the output voltage from the Ath-stage first-GOA sub-circuit and the input voltage for the first-stage second-GOA sub-circuit having a substantially the same voltage level; the Ath-stage first GOA sub-circuit, the voltage transmitting circuit, and the first-stage second-GOA being cascaded in series; the input port of the voltage transmitting circuit is connected to an output port of the Ath-stage first-GOA sub-circuit and configured to receive the output voltage from the Ath-stage first-GOA sub-circuit; and the output port of the voltage transmitting circuit is connected to an input port of the first-stage second-GOA sub-circuit and configured to output a forwarded voltage to the first-stage second-GOA as the input voltage for the first-stage second-GOA sub-circuit, the output voltage from the Ath-stage first-GOA sub-circuit being substantially equal to the input voltage for the first-stage second-GOA sub-circuit; and when A is greater than 1, the A stages of first-GOA-sub-circuits cascaded from the first stage GOA sub-circuit to the Ath-stage first GOA sub-circuit; when B is greater than 1, the B stages of second-GOA-sub-circuits cascaded from the first stage second-GOA-sub-circuit to the Bth stage second-GOA-sub-circuit.

Optionally, a gate line connected to the output port of the Ath-stage first GOA sub-circuit is adjacent to a gate line connected to an output port of the first stage second-GOA sub-circuit.

Optionally, the voltage transmitting circuit is configured to receive the output voltage from the Ath-stage first-GOA sub-circuit and output the forwarded voltage to the first-stage second-GOA during a touch control phase in a display panel having the gate driver on array circuit.

Optionally, the voltage transmitting circuit comprises C stages of voltage transmitting GOA sub-circuits, C being a positive integer greater than or equal to 1, each of the C stages of voltage transmitting GOA sub-circuits having an input port and an output port, the input port of a first-stage voltage transmitting GOA sub-circuit being the input port of the voltage transmitting circuit, the output port of each of the C stages of voltage transmitting GOA sub-circuits being connected to the input port of a next adjacent-stage voltage transmitting GOA sub-circuit, the output port of a Cth-stage voltage transmitting GOA sub-circuit being the output port of the voltage transmitting circuit; when C is greater than 1, the C stages of voltage transmitting GOA sub-circuits cascaded from the first-stage voltage transmitting GOA sub-circuit to the Cth-stage voltage transmitting GOA sub-circuit.

Optionally, any two adjacent-stage first-GOA sub-circuits have a first separation defined by two gate lines connected to the output ports of the two adjacent-stage first-GOA sub-circuits, any two adjacent-stage second-GOA sub-circuits have a second separation defined by two gate lines connected to the output ports of the two adjacent-stage second-GOA sub-circuits, the second separation being substantially equal to the first separation and equal to a separation between the Ath-stage first-GOA sub-circuit and the first-stage second-GOA sub-circuit.

Optionally, each of the voltage transmitting GOA sub-circuits comprises a first input sub-unit, an output sub-unit, a first pull-down sub-unit, and a second pull-down sub-unit; the first input sub-unit is connected to a first signal port, a second signal port, and a first node, and is configured to control potential level at the first node under control of a first control signal from the first signal port and a second control signal from the second signal port; the first signal port of the first-stage voltage transmitting GOA sub-circuit is the output port of the Ath-stage first-GOA sub-circuit, the first signal port of a voltage transmitting GOA sub-circuit other than the first-stage voltage transmitting GOA sub-circuit is the output port of a previous adjacent-stage voltage transmitting GOA sub-circuit; the output sub-unit is connected to a third signal port, the first node, and a second node, and is configured to control potential level at the second node under control of a third control signal from the third signal port and the potential level at the first node; the first pull-down sub-unit is connected to a fourth signal port, a fifth signal port, and the first node and is configured to control potential level at the first node under control of the fourth control signal from the fourth signal port and the fifth control signal from the fifth signal port; the fifth signal port of a voltage transmitting GOA sub-circuit other than the Cth-stage voltage transmitting GOA sub-circuit is the output port of a next adjacent-stage voltage transmitting GOA sub-circuit, the fifth signal port of the Cth-stage voltage transmitting GOA sub-circuit is the output port of the first-stage second-GOA sub-circuit; the second pull-down sub-unit is connected to the fourth signal port, a sixth signal port, and the second node, and is configured to control the potential level at the second node under control of the fourth control signal from the fourth signal port and a sixth control signal from the sixth signal port; and the input port of the voltage transmitting circuit is a terminal of the first input sub-unit of the first-stage voltage transmitting GOA sub-circuit connected to the first signal port, the output port of the voltage transmitting circuit is the second node of the Cth-stage voltage transmitting GOA sub-circuit.

Optionally, the first input sub-unit comprises a first transistor, the output sub-unit comprises a second transistor, the first pull-down sub-unit comprises a third transistor, and the second pull-down sub-unit comprises a fourth transistor; the first transistor comprises a first electrode connected to the second signal port, a second electrode connected to the first node, and a control electrode connected to the first signal port; the second transistor comprises a first electrode connected to the third signal port, a second electrode connected to the second node, and a control electrode connected to the first node; the third transistor comprises a first electrode connected to the fourth signal port, a second electrode connected to the first node, and a control electrode connected to the fifth signal port; and the fourth transistor comprises a first electrode connected to the fourth signal port, a second electrode connected to the second node, and a control electrode connected to the sixth signal port.

Optionally, each of the voltage transmitting GOA sub-circuits comprises a second input sub-unit, an output sub-unit, and a second pull-down sub-unit; the second input sub-unit is connected to a first signal port, a sixth signal port, and a first node, and is configured to control potential level at the first node under control of a first control signal received from the first signal port and a sixth control signal received from the sixth signal port; the first signal port of the first-stage voltage transmitting GOA sub-circuit is the output port of the Ath-stage first-GOA sub-circuit, the first signal port of a voltage transmitting GOA sub-circuit other than the first-stage voltage transmitting GOA sub-circuit is the output port of a previous adjacent-stage voltage transmitting GOA sub-circuit; the output sub-unit is connected to a third signal port, the first node, and a second node, and is configured to control potential level at the second node under control of a third control signal received from the third signal port and the potential level at the first node; the second pull-down sub-unit is connected to a fourth signal port, a sixth signal port, and the second node, and is configured to control the potential level at the second node under control of a fourth control signal received from the fourth signal port and a sixth control signal received from the sixth signal port; and the input port of the voltage transmitting circuit is a terminal of the second input sub-unit of the first-stage voltage transmitting GOA sub-circuit connected to the first signal port, the output port of the voltage transmitting circuit is the second node of the Cth-stage voltage transmitting GOA sub-circuit.

Optionally, the second input sub-unit comprises a fifth transistor, the output sub-unit comprises a second transistor, and the second pull-down sub-unit comprises a fourth transistor; the fifth transistor comprises a first electrode connected to the first signal port, a second electrode connected to the first node, and a control electrode connected to the sixth signal port; the second transistor comprises a first electrode connected to the third signal port, a second electrode connected to the second node, and a control electrode connected to the first node; and the fourth transistor comprises a first electrode connected to the fourth signal port, a second electrode connected to the second node, and a control electrode connected to the sixth signal port.

Optionally, each of the voltage transmitting GOA sub-circuits comprises a first input sub-unit, an output sub-unit, a third pull-down sub-unit, a fourth pull-down sub-unit, and a control pull-down sub-unit; the first input sub-unit is connected to a first signal port, a second signal port, and a first node, and is configured to control potential level at the first node under control of a first control signal from the first signal port and a second control signal from the second signal port; the first signal port of the first-stage voltage transmitting GOA sub-circuit is the output port of the Ath-stage first-GOA sub-circuit, the first signal port of a voltage transmitting GOA sub-circuit other than the first-stage voltage transmitting GOA sub-circuit is the output port of the previous adjacent-stage voltage transmitting GOA sub-circuit; the output sub-unit is connected to a third signal port, the first node, and a second node, and is configured to control potential level at the second node under control of a third control signal from the third signal port and the potential level at the first node; the third pull-down sub-unit is connected to a fourth signal port, a third node, and the first node, and is configured to control the potential level at the first node under control of a fourth control signal from the fourth signal port and a potential level at the third node; the fourth pull-down sub-unit is connected to the fourth signal port, the third node, and the second node, and is configured to control the potential level at the second node under control of the fourth control signal from the fourth signal port and the potential level at the third node; the control pull-down sub-unit is connected to the third node for outputting a voltage to the third node to set the potential level at the third node; and the input port of the voltage transmitting circuit is a terminal of the first input sub-unit of the first-stage voltage transmitting GOA sub-circuit connected to the first signal port, the output port of the voltage transmitting circuit is the second node of the Cth-stage voltage transmitting GOA sub-circuit.

Optionally, the first input sub-unit comprises a first transistor, the output sub-unit comprises a second transistor, the third pull-down sub-unit comprises a sixth transistor, the fourth pull-down sub-unit comprises a seventh transistor; the first transistor comprises a first electrode connected to the second signal port, a second electrode connected to the first node, and a control electrode connected to the first signal port; the second transistor comprises a first electrode connected to the third signal port, a second electrode connected to the second node, and a control electrode connected to the first node; the sixth transistor comprises a first electrode connected to the fourth signal port, a second electrode connected to the first node, and a control electrode connected to the third node; and the seventh transistor comprises a first electrode connected to the fourth signal port, a second electrode connected to the second node, and a control electrode connected to the third node.

Optionally, each of the first-GOA sub-circuits comprises: a first input sub-unit, an output sub-unit, a third pull-down sub-unit, a fourth pull-down sub-unit, and a control pull-down sub-unit; the first input sub-unit is connected to a first signal port, a second signal port, and a first node, and is configured to control potential level at the first node under control of a first control signal from the first signal port and a second control signal from the second signal port, the first signal port of the first-stage first-GOA sub-circuit is the start-cycle signal port, the first signal port of a first-GOA sub-circuit other than the first-stage first-GOA sub-circuit is the output port of a previous adjacent-stage first-GOA sub-circuit; the output sub-unit is connected to a third signal port, the first node, and a gate node connected to a gate line of a same stage, and is configured to control potential level at the gate node under control of a third control signal from the third signal port and the potential level at the first node; the third pull-down sub-unit is connected to a fourth signal port, a third node, and the first node, and is configured to control the potential level at the first node under control of a fourth control signal from the fourth signal port and potential level at the third node; the fourth pull-down sub-unit is connected to the fourth signal port, the third node, and the gate node, and is configured to control the potential level at the gate node under control of the fourth control signal and the potential level at the third node; and the control pull-down sub-unit is connected to the third node for outputting a voltage to the third node to set the potential level at the third node.

Optionally, the first input sub-unit comprises a first transistor, the output sub-unit comprises a second transistor, the third pull-down sub-unit comprises a sixth transistor, and the fourth pull-down sub-unit comprises a seventh transistor; the first transistor comprises a first electrode connected to the second signal port, a second electrode connected to the first node, and a control electrode connected to the first signal port; the second transistor comprises a first electrode connected to the third signal port, a second electrode connected to the gate node, and a control electrode connected to the first node; the sixth transistor comprises a first electrode connected to the fourth signal port, a second electrode connected to the first node, and a control electrode connected to the third node; and the seventh transistor comprises a first electrode connected to the fourth signal port, a second electrode connected to the gate node, and a control electrode connected to the third node.

Optionally, each of the one or more first-GOA sub-circuits and the one or more second-GOA sub-circuits has a substantially the same circuit structure.

Optionally, each of the first transistor, the second transistor, the third transistor, the fourth transistor, the fifth transistor, the sixth transistor, and the seventh transistor is a N-type transistor.

Optionally, each of the first transistor, the second transistor, the third transistor, the fourth transistor, the fifth transistor, the sixth transistor, and the seventh transistor is a P-type transistor.

Optionally, the Ath-stage first GOA sub-circuit and the first stage second-GOA sub-circuit have a substantially the same circuit structure.

Optionally, each of the one or more first-GOA sub-circuits and the one or more second GOA sub-circuits has a substantially the same circuit structure.

In another aspect, the present invention provides a display panel comprising a gate driver on array (GOA) circuit described herein.

Optionally, the display panel is operated in a time-division driving mode comprising a display mode and a touch control mode; the voltage transmitting circuit is configured to receive the output voltage and output the forwarded voltage to the first-stage second-GOA during the touch control mode.

In another aspect, the present invention provides a display apparatus comprising a display panel described herein.

In another aspect, the present invention provides a gate driving method in a display panel described herein, comprising outputting the output voltage from the Ath-stage first-GOA sub-circuit to the input port of the voltage transmitting circuit; and outputting the forwarded voltage from the output port of the voltage transmitting circuit to the input port of the first-stage second-GOA sub-circuit as the input voltage for the first-stage second-GOA sub-circuit; wherein the output voltage is substantially equal to the input voltage.

Optionally, the display panel is operated in a time-division driving mode comprising a display mode and a touch control mode; outputting the output voltage and the step of outputting the forwarded voltage are performed during the touch control mode between a first display mode and a second display mode.

Optionally, the method further comprises providing a first gate driving signal from the Ath-stage first-GOA sub-circuit to a gate line connected to the output port of the Ath-stage first-GOA sub-circuit in the first display mode; and providing a second gate driving signal from the first-stage second-GOA sub-circuit to a gate line connected to the output port of the first-stage second-GOA sub-circuit in the second display mode; wherein the first gate driving signal is substantially equal to the second driving signal.

Optionally, the gate line connected to the output port of the Ath-stage first-GOA sub-circuit and the gate line connected to the output port of the first-stage second-GOA sub-circuit are adjacent to each other in the display panel.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
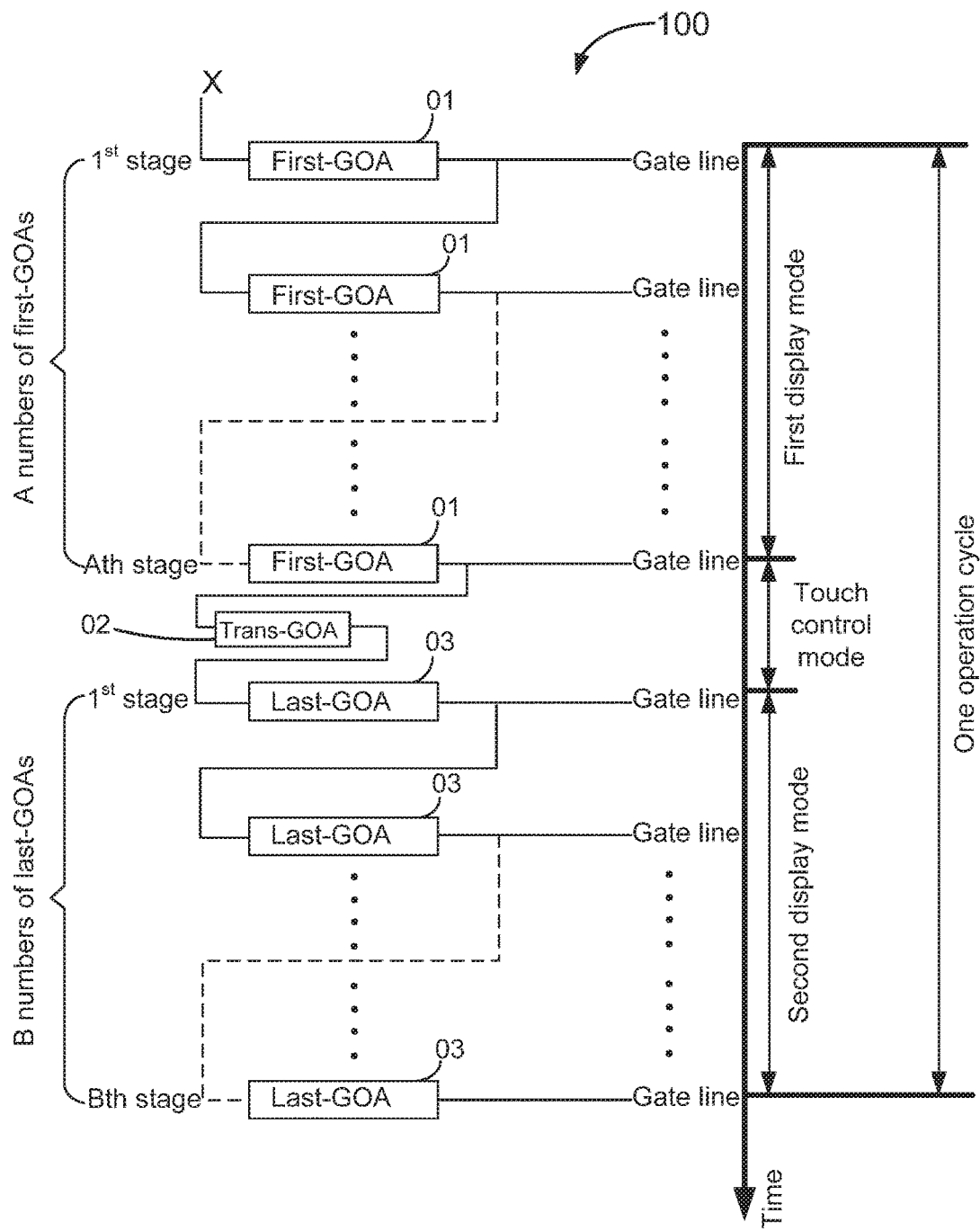
FIG. 1 is a simplified diagram of a GOA circuit in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In a display panel, each pixel contains a thin-film transistor (TFT). The gates of TFTs in a row of pixels are commonly connected to a gate line. The drain of a TFT is connected to a data line crossing over the gate line. The source of a TFT is connected to a pixel electrode. By applying a gate driving signal on the gate through the gate line, the TFTs in the row of pixels may be turned on so that a display signal voltage can be written to the pixel electrode to control transmittance of the liquid crystal layer in each pixel. In a conventional display panel, the gate voltage is applied to the gate line by controlling a GOA circuit. The GOA circuit includes multiple gate driving units cascaded in multiple stages. Each gate driving unit corresponds to a gate line in a row of multiple pixels. The gate driving unit includes an input sub-unit, a pull-down sub-unit, and an output sub-unit. The input sub-unit of a current-stage gate driving unit is used to receive a voltage signal from an output port of a last-stage gate driving unit. The pull-down sub-unit is used to pull down potential level at the output port to a low voltage level. The output sub-unit is used to pull up the potential level at the output port to a high voltage level. Optionally, thin-film transistors may be used for making the gate driving unit and each sub-unit thereof.

The thin-film transistor itself has a characterized leakage current by design, which often causes undesirable effects in the operation of the gate driving unit. In some embodiments, a conventional display panel may be operated in a time-division mode having a display mode and a touch control mode. During the touch control mode, output of a gate driving signal at a certain stage of gate driving unit may be put on hold until the touch control mode is over. Due to the leakage current of the thin-film transistor, the level of the gate driving signal on hold will gradually decay over time. When that stage of gate driving circuit is reactivated in a subsequent display mode, the corresponding output voltage signal may be lower than the gate driving signal under a normal condition. This will cause a dark line to be shown on the display panel due to lower display intensity, leading to a poor display effect.

Accordingly, the present invention is directed to a gate drive circuit, a display panel and a display apparatus having the same, and driving method thereof that substantially obviate one or more of the problems due to limitations and disadvantages of the related art. In one aspect, the present disclosure provides a gate driver on array circuit. In some embodiments, the GOA circuit includes a first GOA circuit; a second GOA circuit; and a voltage transmitting circuit configured to transmit an output voltage from the first GOA circuit to the second GOA circuit as an input voltage for the second GOA circuit; the output voltage from the first GOA circuit and the input voltage for the second GOA circuit having a substantially the same voltage level. Optionally, an input port of the voltage transmitting circuit is connected to an output port of the first GOA circuit and configured to receive the output voltage from the first GOA circuit; and an output port of the voltage transmitting circuit is connected to an input port of the second GOA circuit and configured to output a forwarded voltage to the second GOA circuit as the input voltage for the second GOA circuit. In some embodiments, the GOA circuit includes A stages of first-GOA units; B stages of second-GOA units; and a voltage transmitting circuit for transmitting an output voltage from a Ath-stage first-GOA unit as an input voltage for a first-stage second-GOA unit. Voltage level of the output voltage from the Ath-stage first-GOA unit is substantially maintained during the transmission, i.e., the output voltage from the Ath-stage first-GOA unit and the input voltage for the first-stage second-GOA unit have a substantially the same voltage level. The Ath-stage first GOA unit, the voltage transmitting circuit, and the first-stage second-GOA being cascaded in series. A and B are both positive integers greater than or equal to 1. When A is greater than 1, the A stages of first-GOA-sub-circuits cascaded from the first stage GOA sub-circuit to the Ath-stage first GOA sub-circuit. When A equals to 1, the first stage first-GOA-sub-circuit and the Ath-stage first GOA sub-circuit are a same first GOA sub-circuit. When B is greater than 1, the B stages of second-GOA-sub-circuits cascaded from the first stage second-GOA-sub-circuit to the Bth stage second-GOA-sub-circuit. When B equals to 1, the first stage second-GOA-sub-circuit and the Bth-stage second GOA sub-circuit are a same first GOA sub-circuit.

Optionally, each of the first-GOA units includes an input port and an output port. The output port is connected respectively to a corresponding gate line and a corresponding input port of a next adjacent-stage first-GOA unit. The input port of the first-stage first-GOA unit is connected to a start-cycle signal port. The output port of the Ath-stage first-GOA unit is connected to a corresponding gate line.

Optionally, each of the one or more second-GOA units includes an input port and an output port. The output port is connected respectively to a corresponding gate line and a corresponding input port of a next adjacent-stage second-GOA unit. The output port of the Bth-stage second-GOA unit is connected to a corresponding gate line.

Optionally, an input port of the voltage transmitting circuit is connected to the output port of the Ath-stage first-GOA unit, and is configured to receive the output voltage from the Ath-stage first-GOA unit. An output port of the voltage transmitting circuit is connected to the input port of the first-stage second-GOA unit, and is configured to output a forwarded voltage to the first-stage second-GOA as the input voltage for the first-stage second-GOA unit. The output voltage is substantially equal to the input voltage.

Any appropriate transistors may be used in the present GOA circuit. In some embodiments, the transistor in the GOA is a thin-film transistor or a field-effect transistor. Optionally, the transistor is a switch transistor. Optionally, the switch transistor includes a control electrode, a first electrode, and a second electrode. The first electrode and the second electrode of the switch transistor may be, e.g., a source electrode and a drain electrode. A middle terminal of the switch transistor corresponds to the control electrode of the transistor, the source electrode is typically connected to a signal input port, and the drain electrode is typically connected to a signal output port. The transistor may be P-type transistor or N-type transistor. Optionally, a P-type transistor is used as a switch transistor, the P-type transistor is in a conduction state when the control electrode is at low voltage level (i.e., control electrode potential level is lower than source potential level), and in a block state when the control electrode is at high voltage level (i.e., control electrode potential level is higher than source potential level). Optionally, an N-type transistor is used as a switch transistor, it is in a conduction state when the control electrode is at high voltage level, and in a block state when the control electrode is at low voltage level. Optionally, a P-type transistor may be set to an amplification state or a saturation state when the control electrode is at low voltage level and when an absolute value of the potential difference between the control electrode and source is greater than threshold voltage of the transistor. Optionally, the N-type transistor may be set to an amplification state or a saturation state when the control electrode is at high voltage level and the potential difference between the control electrode and source is greater than threshold voltage of the transistor.

In some embodiments, a display panel having the present GOA is operated in a time-division mode having at least a display mode and a touch control mode. Optionally, the display panel is an in-cell type display panel. Various embodiments of the time-division modes may be implemented. For example, the time-division mode may include a touch control mode at the beginning of a frame of image or at the end of a frame of image. Optionally, the time-division mode may include a touch control mode between display of two adjacent rows of gate lines, i.e., the time-division mode includes a touch control mode between two adjacent first and second display mode. During the first display mode, image is displayed in one or more rows of pixels. During the second display mode, image is display in one or more rows of pixels. The touch control mode is inserted between the first display mode and the second display model. Optionally, the display panel has a scan frequency of 120 Hz.

FIG. 1 is a simplified diagram of a GOA circuit in some embodiments. Referring to FIG. 1, a GOA circuit 100 includes A numbers of first-GOA units 01 cascaded from a first-stage first-GOA unit to an Ath-stage first-GOA unit, B numbers of second-GOA units 03 cascaded from a first-stage second-GOA unit a Bth-stage second-GOA unit, and a voltage transmitting circuit 02 connected between the A numbers of first-GOA units 01 and the B numbers of second-GOA units 03. As used herein, A and B are positive integers greater than or equal to 1. The voltage transmitting circuit 02 transmits an output voltage from the Ath-stage first-GOA unit to the first-stage second-GOA unit to be used as an input voltage for the first-stage second-GOA unit. Voltage level of the output voltage from the Ath-stage first-GOA unit is substantially maintained during the transmission, i.e., the output voltage from the Ath-stage first-GOA unit and the input voltage for the first-stage second-GOA unit have a substantially the same voltage level. The Ath-stage first GOA unit, the voltage transmitting circuit, and the first-stage second-GOA are cascaded in series.

In particular, the A numbers of first-GOA units include a first-stage first-GOA unit connected to a second-stage first-GOA unit and so on to an Ath-stage first-GOA unit. Each-stage first-GOA unit has a substantially same circuit structure including an input port and an output port. The input port of the first-stage first-GOA unit is connected to a start-cycle signal port X. The input port of any intermediate unit, e.g., an ath-stage first-GOA unit, is connected to a gate line and the corresponding output port of a previous (a−1)th-stage first-GOA unit, where a is a positive integer greater than or equal to 2 and smaller than or equal to A. The output port of the Ath-stage first-GOA unit is connected to an input port of the voltage transmitting circuit 02.

Similarly, the B numbers of second-GOA units include a first-stage second-GOA unit connected to a second-stage second-GOA unit and so on to a Bth-stage second-GOA unit. Each-stage second-GOA unit has a substantially same circuit structure, i.e., a second-GOA unit 03, including an input port and an output port. In an embodiment, each second-GOA unit has a circuit structure substantially the same as that of each first-GOA unit. The output port of the voltage transmitting circuit 02 is connected to the corresponding input port of the first-stage second-GOA unit. The input port of any intermediate unit, e.g., a bth-stage second-GOA unit, is connected to a gate line and the corresponding output port of a previous (b−1)th-stage second-GOA unit, where b is a positive integer greater than or equal to 2 and smaller than or equal to B. The output port of the Bth-stage second-GOA unit is connected to a corresponding gate line.

In some embodiments, a display panel having the present GOA is operated in a time-division mode having at least a display mode and a touch control mode. Optionally, the time-division mode may include a touch control mode between display of two adjacent rows of gate lines, i.e., the time-division mode includes a touch control mode between two adjacent first and second display mode. During the first display mode, image is displayed in one or more rows of pixels. During the second display mode, image is display in one or more rows of pixels. The touch control mode is inserted between the first display mode and the second display model. During the touch control mode, the input voltage received at the input port of the voltage transmitting circuit 03 is substantially equal to the output voltage outputted at the output port of the voltage transmitting circuit 03, which is used as the input voltage for the first-stage second-GOA unit. The A numbers of first-GOA units are configured to be operated in a first display mode. The B numbers of second-GOA units are configured to be operated in a second display mode. In some embodiments, the touch control mode is inserted between the first display mode and the second display mode.

As described above, the GOA circuit according to the present disclosure includes a voltage transmitting circuit having its input port connected to the output port of a Ath-stage first-GOA unit and its output port connected to the input port of a first-stage second-GOA unit. Each first-GOA unit and each second-GOA unit respectively connect a gate line. A gate line connected to the output port of the Ath-stage first GOA unit is adjacent to a gate line connected to the output port of the first stage second-GOA unit, i.e., the row of pixels having the gate line connected to the output port of the Ath-stage first GOA unit is adjacent to the row of pixels having the gate line connected to the output port of the first stage second-GOA unit. The voltage transmitting circuit is not connected to any gate line. During the touch control mode, a high voltage signal outputted at the Ath-stage first-GOA unit is passed to the first-stage second-GOA unit through the voltage transmitting circuit. An output voltage outputted at the output port of the voltage transmitting circuit is substantially equal to an input voltage received at the input port of the voltage transmitting circuit, thereby obviating the voltage drop issue at the first-stage second-GOA due to leakage current in the TFTs of the GOA circuit. Thus, the gate driving signal at every output port of every-stage GOA unit (no matter it is a first-GOA unit or a second-GOA unit) may be maintained at a substantially the same level, eliminating possible dark line on the display panel due to the TFT leakage current. By having this design, display quality in a display panel having the present GOA circuit may be significantly enhanced.

Figure 2:
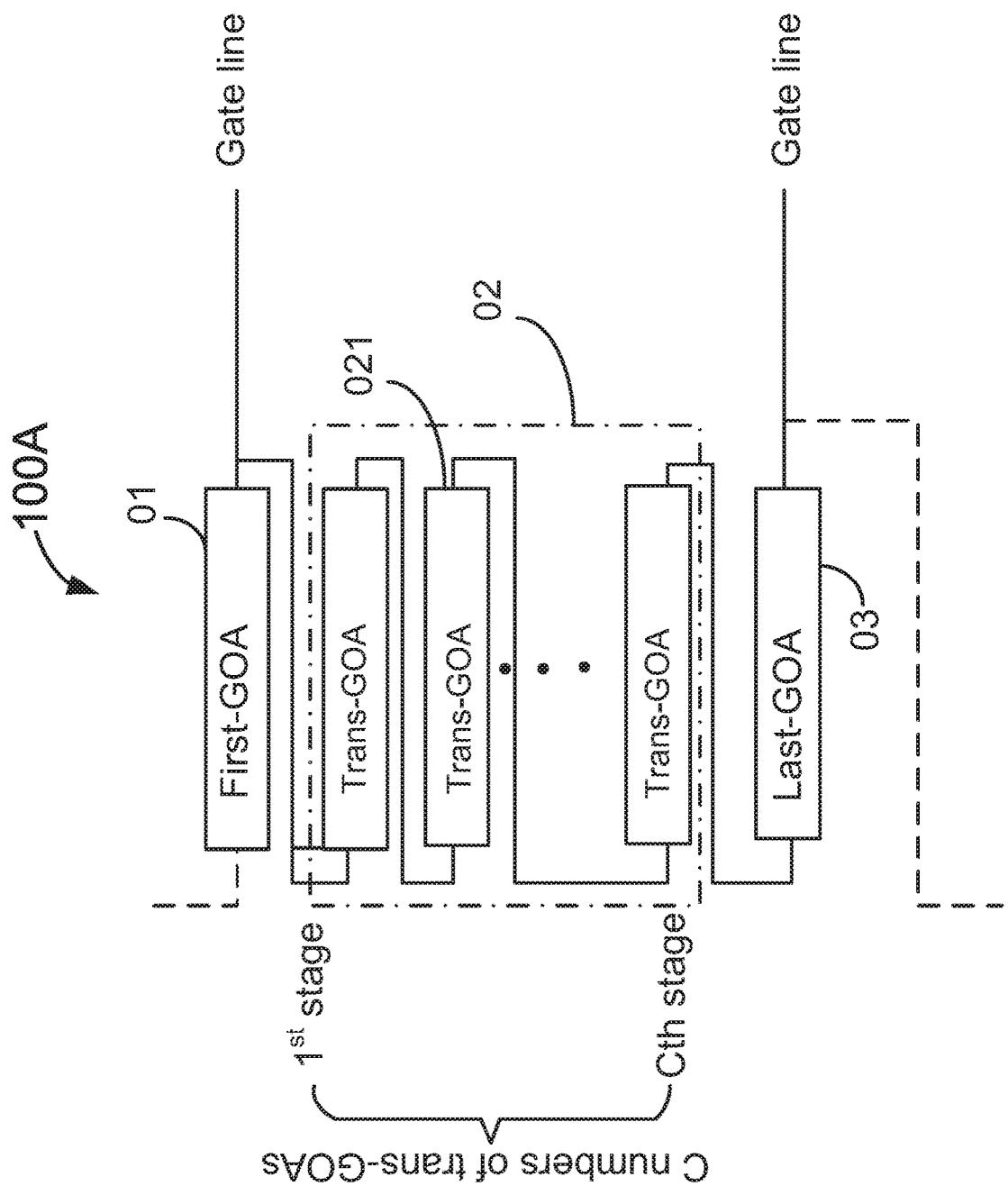
FIG. 2 is a simplified diagram of a portion of a GOA circuit in some embodiments.

FIG. 2 is a simplified diagram of a portion of a GOA circuit in some embodiments. Referring to FIG. 2, a GOA circuit 100A includes a voltage transmitting circuit 02 having C stages of voltage transmitting GOA units 021. As used herein, C is a positive integer greater than or equal to 1. When C is greater than 1, the C stages of voltage transmitting GOA sub-circuits cascaded from the first-stage voltage transmitting GOA sub-circuit to the Cth-stage voltage transmitting GOA sub-circuit. When C equals to 1, the first stage voltage transmitting GOA sub-circuit and the Cth-stage voltage transmitting GOA sub-circuit are a same voltage transmitting GOA sub-circuit. Each voltage transmitting GOA unit 021 has a substantially the same circuit structure having an input port and an output port.

Referring to FIG. 2, an input port of the first-stage voltage transmitting GOA unit 021 is the input port of the voltage transmitting circuit 02. The input port of any c-stage voltage transmitting GOA unit is connected to the output port of the previous (c−1)th-stage voltage transmitting GOA unit, where c is a positive integer greater than or equal to 2 and smaller than or equal to C. The output port of the Cth-stage voltage transmitting GOA unit is the output port of the voltage transmitting circuit 02. Each of the C numbers of voltage transmitting GOA units is not connected to any gate line and is configured only to performing a voltage passage function without outputting any gate driving signal.

In an embodiment, any two adjacent stages of first-GOA units 01 has a separation defined by two corresponding gate lines substantially equal to a separation between the Ath-stage first-GOA unit and the first-stage second-GOA unit. Further, the separation between any two adjacent stages of first-GOA units defined by two corresponding gate lines is substantially equal to a separation of any two adjacent-stages of second-GOA units. In other words, the voltage transmitting circuit 02 can be made in a small volume to be inserted into the normal separation between any two adjacent stages of two GOA units. Accordingly, any appropriate GOA circuit may be modified to accommodate the present voltage transmitting circuit (including one or more voltage transmitting GOA units 021), without substantially changing the dimension or layout of the GOA circuit.

Figure 3A:
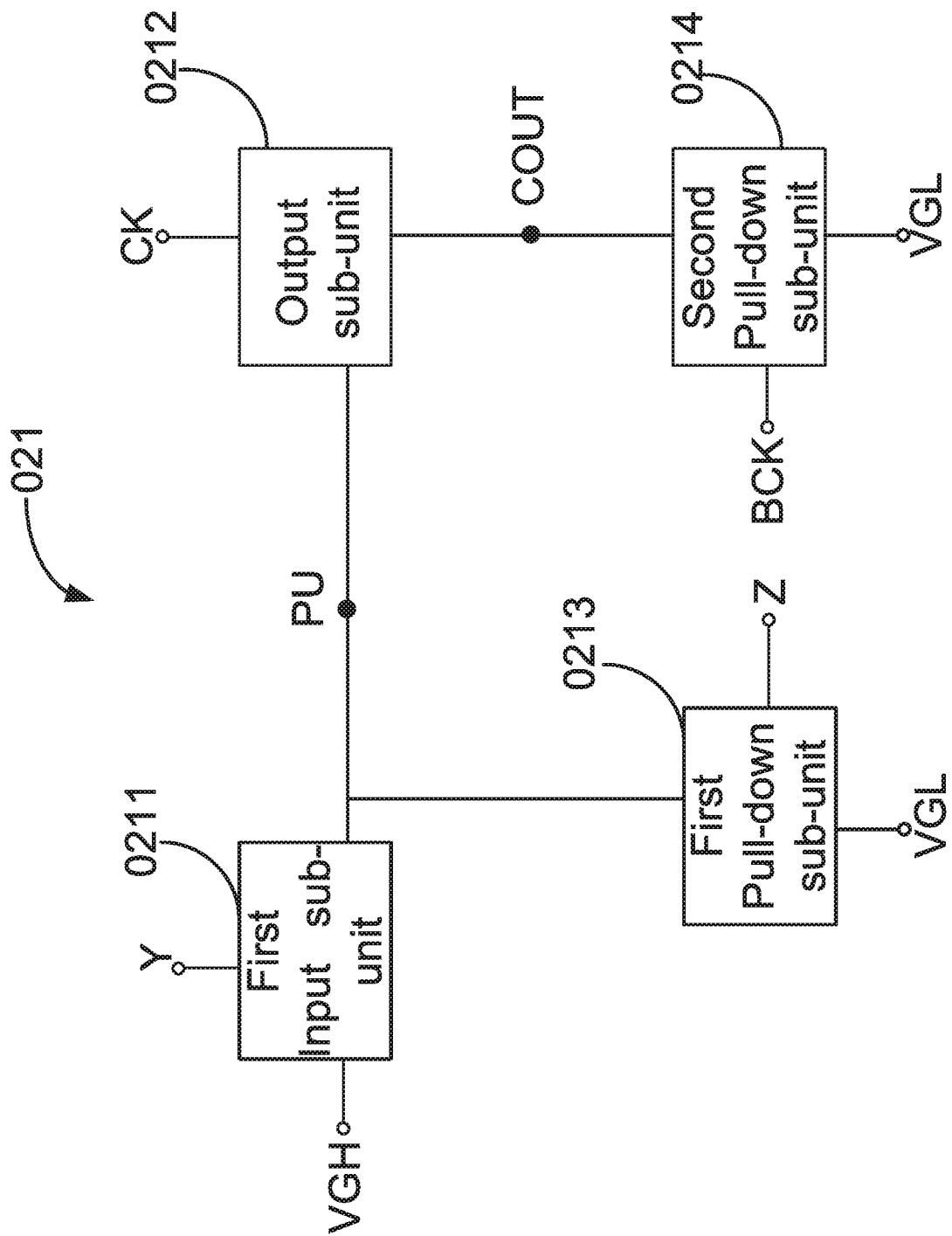
FIG. 3A is a simplified diagram of a voltage transmitting GOA unit in some embodiments.

FIG. 3A is a simplified diagram of a voltage transmitting GOA unit in some embodiments. Referring to FIG. 3A, each voltage transmitting GOA unit 021 in the voltage transmitting circuit 02 may include a first input sub-unit 0211, an output sub-unit 0212, a first pull-down sub-unit 0213, and a second pull-down sub-unit 0214.

Referring to FIG. 3A, the first input sub-unit 0211 is connected respectively to a first signal port Y, a second signal port VGH and a first node PU. The first input sub-unit 0211 is used to control potential level at the first node PU under control of a first control signal received from the first signal port Y and a second control signal from the second signal port VGH. In the first-stage voltage transmitting GOA unit 021, the first signal port Y is also an output port of the Ath-stage first-GOA unit 01. In any cth-stage voltage transmitting GOA unit, the first signal port Y is the output port of previous (c−1)th-stage voltage transmitting GOA unit. Further, the output sub-unit 0212 is connected respectively to a third signal port CK, the first node PU, and a second node COUT. The output sub-unit 0212 is used to control potential level at the second node COUT under control of a third control signal received from the third signal port CK and the potential level at the first node PU.

Further, the first pull-down sub-unit 0213 is connected respectively to a fourth signal port VGL, a fifth signal port Z, and the first node PU. The first pull-down sub-unit 0213 is used to control the potential level at the first node PU under control of a fourth control signal received from the fourth signal port VGL and a fifth control signal received from the fifth signal port Z. In a dth-stage voltage transmitting GOA unit 021, the fifth signal port Z is the output port of next (d+1)th-stage voltage transmitting GOA unit 021. As used herein, d is a positive integer smaller than C. In the Cth-stage voltage transmitting GOA unit 021, the fifth signal port Z is the output port of the first-stage second-GOA unit 03. Furthermore, the second pull-down sub-unit 0214 is connected respectively to the fourth signal port VGL, a sixth signal port BCK, and the second node COUT. The second pull-down sub-unit 0214 is used to control the potential level at the COUT under control of the fourth control signal from the fourth signal port VGL and a sixth control signal received from the sixth signal port BCK.

Referring to FIG. 2 and FIG. 3A, the input port of the voltage transmitting circuit 02 is a same port of the first signal port Y of the first input sub-unit 0211 of the first-stage voltage transmitting GOA unit 021. The output port of the voltage transmitting circuit 02 is the second node COUT of the Cth-stage voltage transmitting GOA unit 021.

Figure 3B:
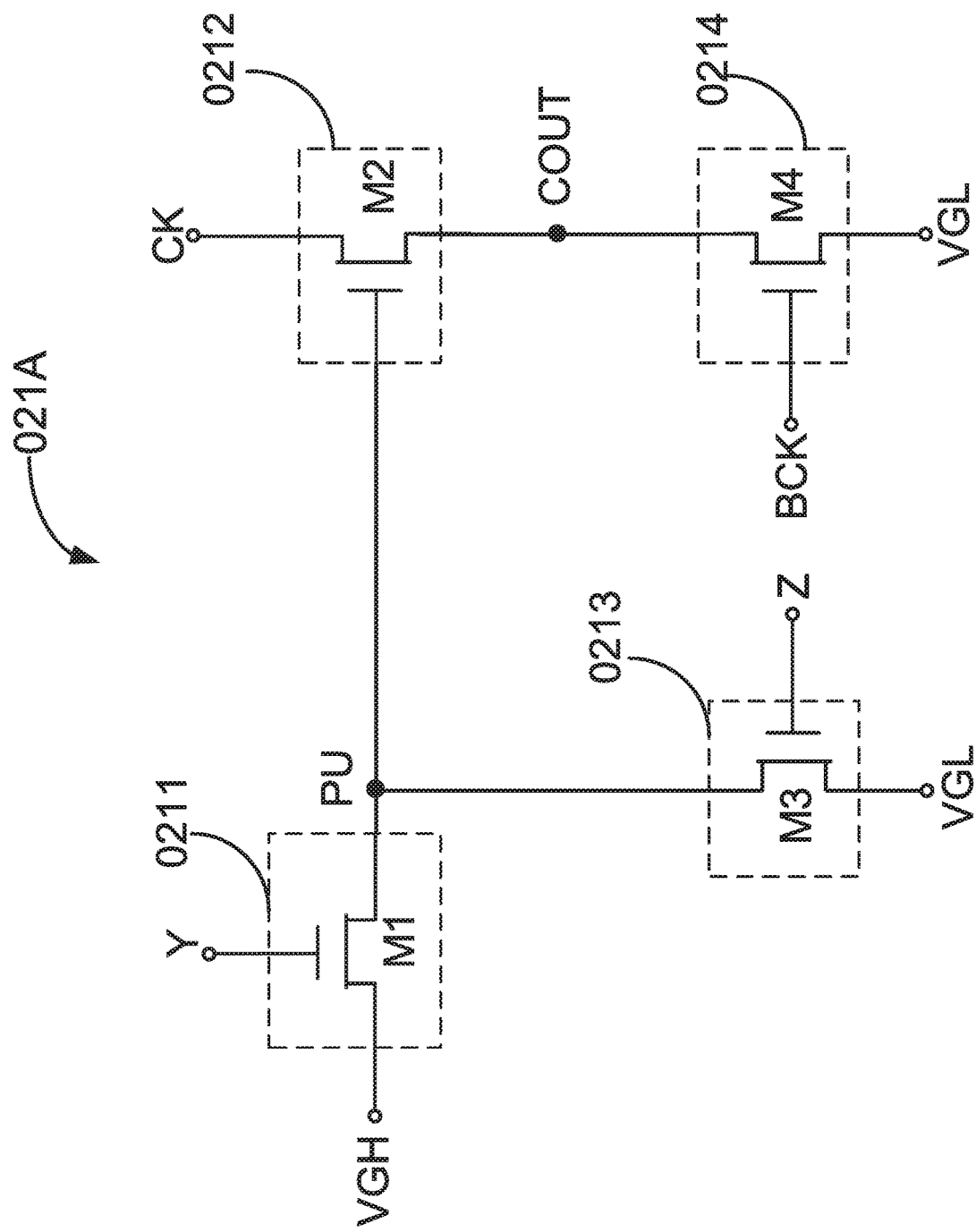
FIG. 3B is a simplified diagram of a voltage transmitting GOA unit in some embodiments.

FIG. 3B is a simplified diagram of a voltage transmitting GOA unit in some embodiments. Referring to FIG. 3B, the first input sub-unit 0211 includes a first transistor M1. The output sub-unit 0212 includes a second transistor M2. The first pull-down sub-unit 0213 includes a third transistor M3. The second pull-down sub-unit 0214 includes a fourth transistor M4.

M1 has a first electrode connected to the second signal port VGH, a second electrode connected to the first node PU, and a control electrode connected to the first signal port Y. M2 has a first electrode connected to the third signal port CK, a second electrode connected to the second node COUT, and a control electrode connected to the first node PU. M3 has a first electrode connected to the fourth signal port VGL, a second electrode connected to the first node PU, and a control electrode connected to the fifth signal port Z. M4 has a first electrode connected to the fourth signal port VGL, a second electrode connected to the second node COUT, and a control electrode connected to the sixth signal port BCK.

Figure 4A:
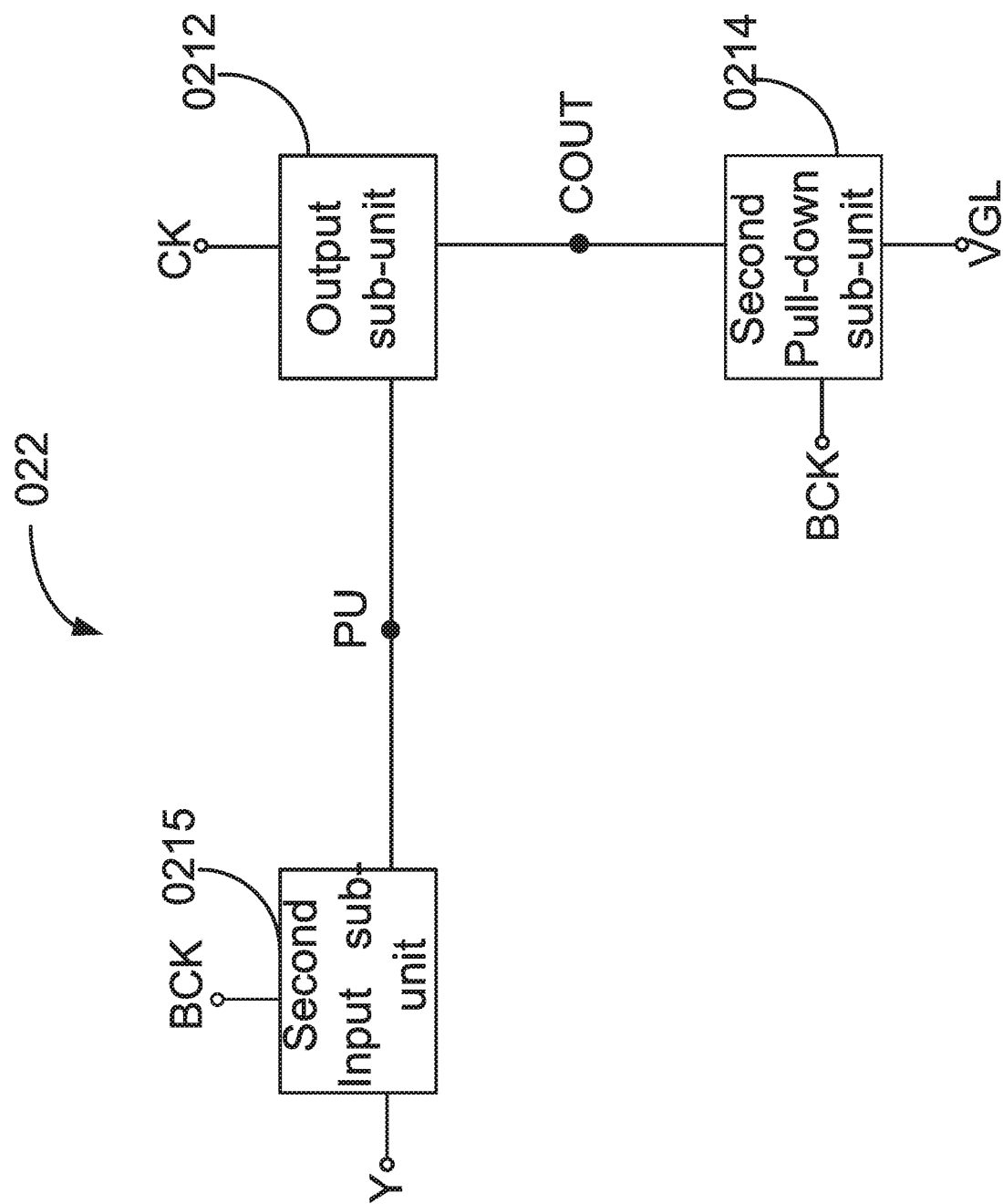
FIG. 4A is a simplified diagram of a voltage transmitting GOA unit in some embodiments.

FIG. 4A is a simplified diagram of a voltage transmitting GOA unit in some embodiments. Referring to FIG. 4, the voltage transmitting GOA unit 022 includes a second input sub-unit 0215, an output sub-unit 0212 and a second pull-down sub-unit 0214. As shown in FIG. 4A, the second input sub-unit 0215 is connected respectively to a first signal port Y, a sixth signal port BCK, and a first node PU. The second input sub-unit 0215 is used to control potential level of the first node PU under control of a first control signal received from the first signal port Y and a sixth control signal received from the sixth signal port BCK. In the first-stage voltage transmitting GOA unit 022, the first signal port Y is also the output port of the Ath-stage first-GOA unit 01. In a cth-stage voltage transmitting GOA unit 022, the first signal port Y is the output port of a previous (c−1)th-stage voltage transmitting GOA unit 022. Further, the output sub-unit 0212 is connected respectively to a third signal port CK, the first node PU, and a second node COUT. The output sub-unit 0212 is used to control potential level at the second node COUT under control of a third control signal received from the third signal port CK and the potential level of the first node PU. Furthermore, the second pull-down sub-unit 0214 is connected respectively to a fourth signal port VGL, a sixth signal port BCK, and the second node COUT. The second pull-down sub-unit 0214 is used to control the potential level of the second node COUT under control of a fourth control signal received from the fourth signal port VGL and a sixth control signal received from the sixth signal port BCK.

In some embodiments, the input port of the voltage transmitting circuit 02 is the first signal port Y in the second input sub-unit 0215 of the first-stage voltage transmitting GOA unit 022. The output port of the voltage transmitting circuit 02 is the second node COUT of the Cth-stage voltage transmitting GOA unit 022.

Figure 4B:
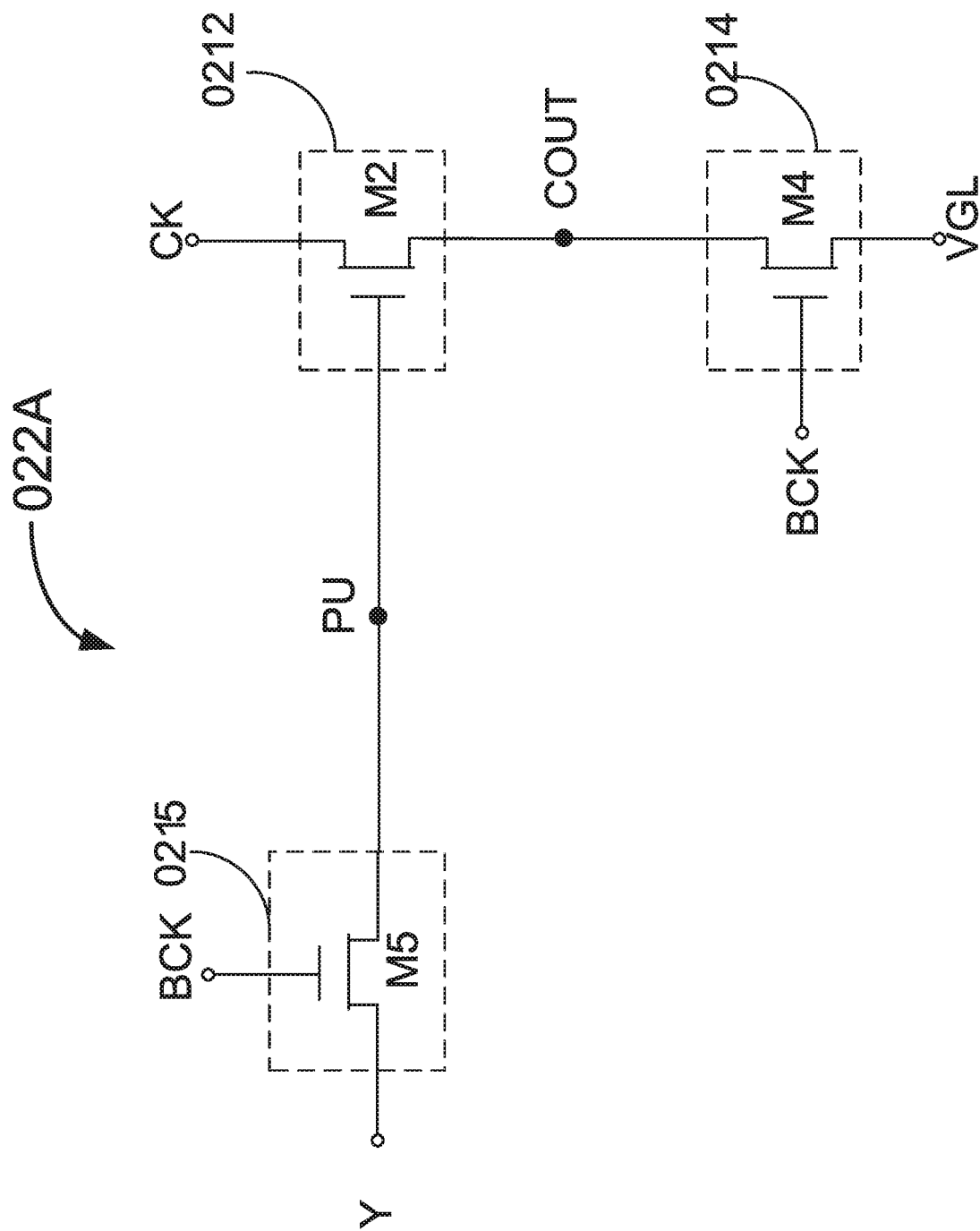
FIG. 4B is a simplified diagram of a voltage transmitting GOA unit in some embodiments.

FIG. 4B is a simplified diagram of a voltage transmitting GOA unit in some embodiments. Referring to FIG. 4B, the second input sub-unit 0215 includes a fifth transistor M5. The output sub-unit 0212 includes a transistor M2. The second pull-down sub-unit 0214 includes a transistor M4. M5 has a first electrode connected to the first signal port Y, a second electrode connected to the first node PU, and a control electrode connected to the sixth signal port BCK. M2 has a first electrode connected to the third signal port CK, a second electrode connected to the second node COUT, and a control electrode connected to the first node PU. M4 has a first electrode connected to the fourth signal port VGL, a second electrode connected to the second node COUT, and a control electrode connected to the sixth signal port BCK.

Figure 5A:
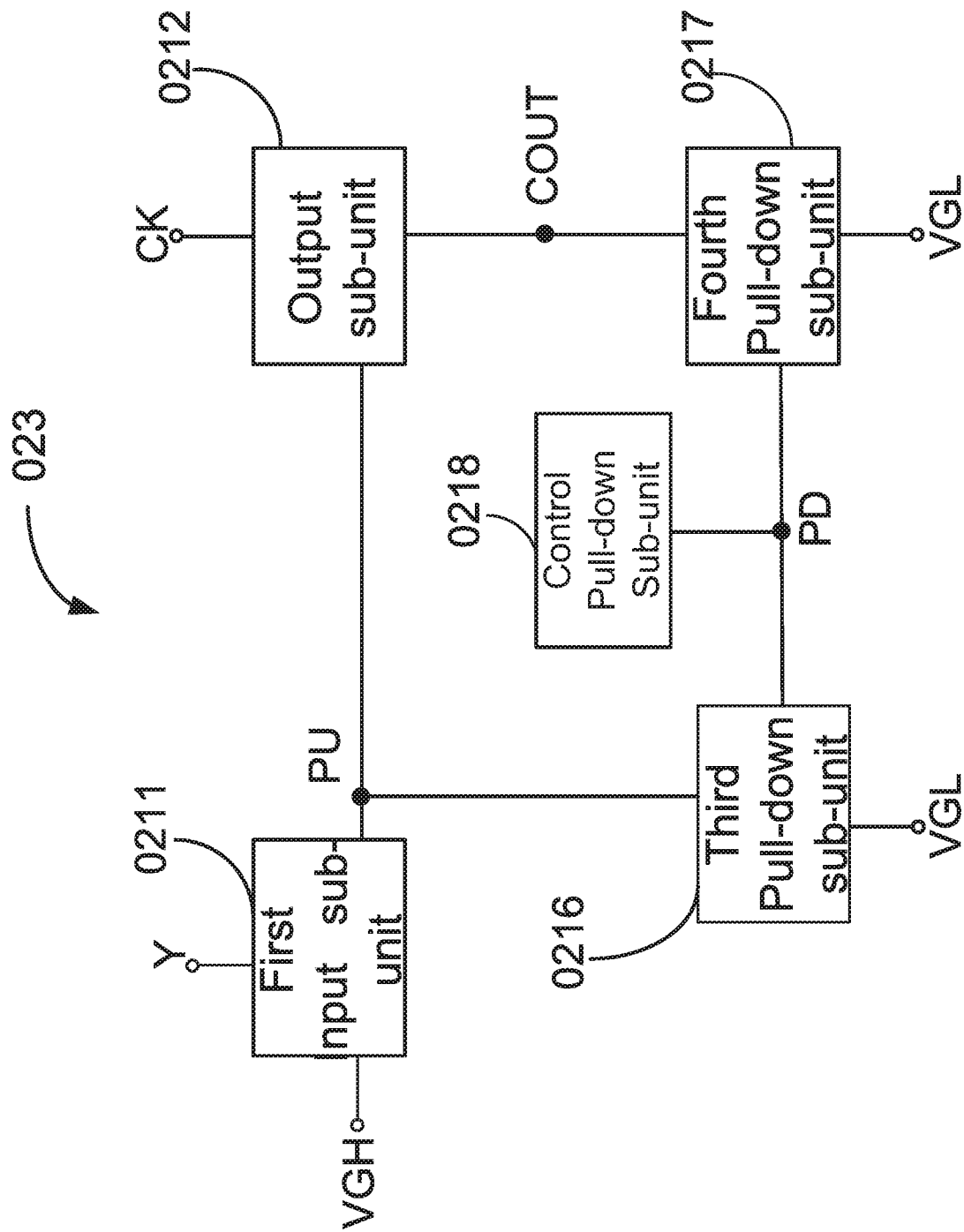
FIG. 5A is a simplified diagram of a voltage transmitting GOA unit in some embodiments.

FIG. 5A is a simplified diagram of a voltage transmitting GOA unit in some embodiments. Referring to FIG. 5A, the voltage transmitting GOA unit 023 includes a first input sub-unit 0211, an output sub-unit 0212, a third pull-down sub-unit 0216, a fourth pull-down sub-unit 0217, and a control pull-down sub-unit 0218. As shown in FIG. 5A, the first input sub-unit 0211 is connected to a first signal port Y, a second signal port VGH, and a first node PU. The first input sub-unit 0211 is configured to control potential level at the first node PU under control of a first control signal from the first signal port Y and a second control signal from the second signal port VGH. In the first-stage voltage transmitting GOA unit 023, the first signal port Y is the output port of the Ath-stage first-GOA unit 01. In a cth-stage voltage transmitting GOA unit 023, the first signal port Y is the output port of a previous (c−1)th-stage voltage transmitting GOA unit 023. Further, the output sub-unit 0212 is connected to a third signal port CK, the first node PU, and a second node COUT. The output sub-unit 0212 is configured to control potential level at the second node COUT under control of a third control signal from the third signal port CK and the potential level of the first node PU. Furthermore, the third pull-down sub-unit 0216 is connected to a fourth signal port VGL, a third node PD, and the first node PU, being configured to control the potential level of the first node PU under control of a fourth control signal from the fourth signal port VGL and a potential level at the third node PD. Moreover, the fourth pull-down sub-unit 0217 is connected to the fourth signal port VGL, the third node PD, and the second node COUT, being configured to control the potential level of the second node COUT under control of the fourth control signal and the potential level of the third node PD.

In an embodiment, the control pull-down sub-unit 0218 is connected to the third node PD, and is configured to pass a voltage signal to the third node PD to set the potential level of the third node PD.

In some embodiments, the input port of the voltage transmitting circuit 02 is the first signal port Y of the first input sub-unit 0211 in the first-stage voltage transmitting GOA unit 023. The output port of the voltage transmitting circuit 02 is the second node COUT of the Cth-stage voltage transmitting GOA unit 023.

Figure 5B:
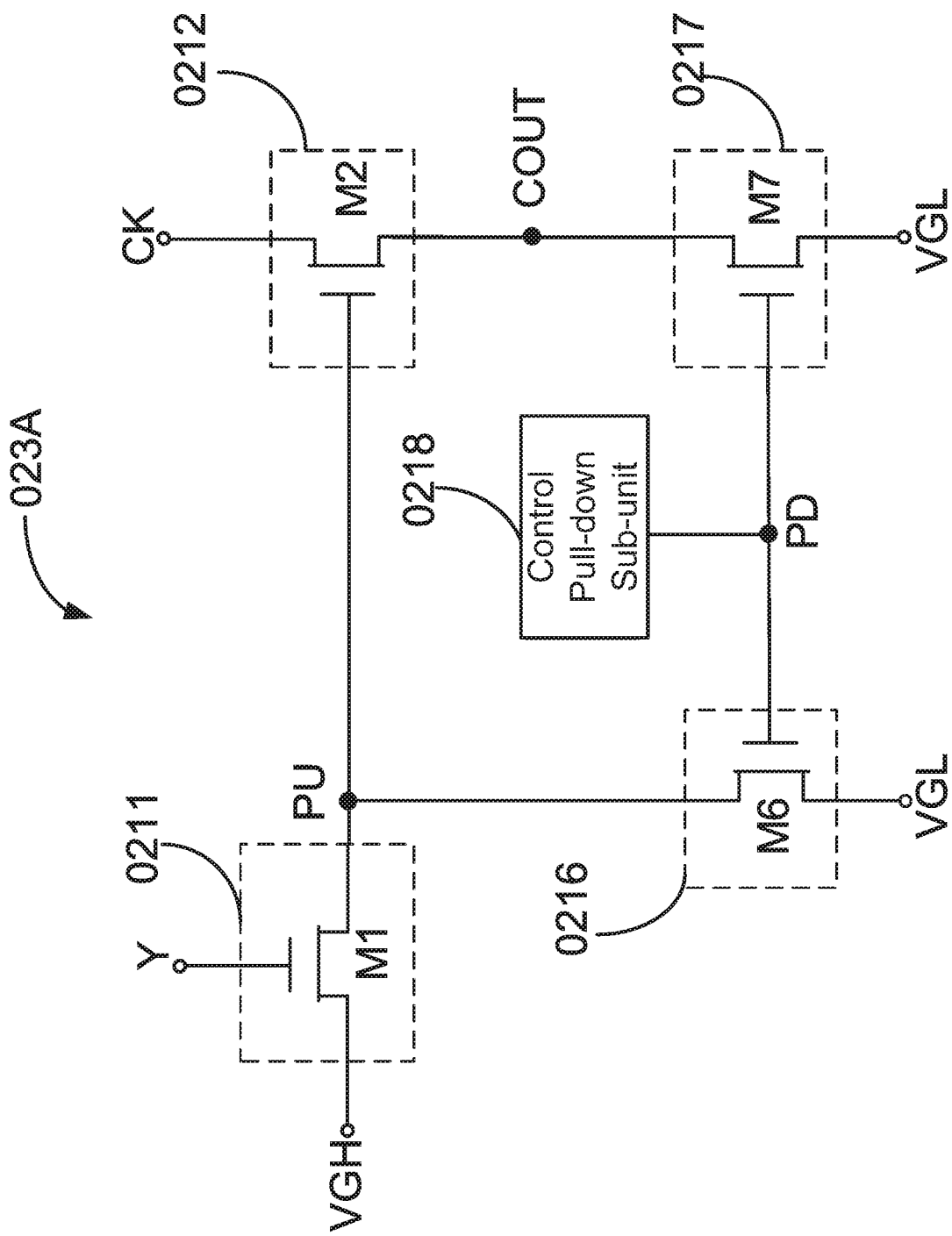
FIG. 5B is a simplified diagram of a voltage transmitting GOA unit in some embodiments.

FIG. 5B is a simplified diagram of a voltage transmitting GOA unit in some embodiments. Referring to FIG. 5B, the first input sub-unit 0211 includes a first transistor M1. The output sub-unit 0212 includes a second transistor M2. The third pull-down sub-unit 0216 includes a sixth transistor M6. The fourth pull-down sub-unit 0217 includes a seventh transistor M7. M has a first electrode connected to the second signal port VGH, a second electrode connected to the first node PU, and a control electrode connected to the first signal port Y. M2 has a first electrode connected to the third signal port CK, a second electrode connected to the second node COUT, and a control electrode connected to the first node PU. M6 has a first electrode connected to the fourth signal port VGL, a second electrode connected to the first node PU, and a control electrode connected to the third node PD. M7 has a first electrode connected to the fourth signal port VGL, a second electrode connected to the second node COUT, and a control electrode connected to the third node PD.

Any appropriate transistor may be used for making the voltage transmitting circuit. Optionally, each of the first transistor M1, the second transistor M2, the third transistor M3, the fourth transistor M4, the fifth transistor M5, the sixth transistor M6, and the seventh transistor M7, is an N-type transistor. Optionally, each of the first transistor M1, the second transistor M2, the third transistor M3, the fourth transistor M4, the fifth transistor M5, the sixth transistor M6, and the seventh transistor M7, is a P-type transistor. For N-type transistor, the first electrode is a source electrode and the second electrode is a drain electrode. For P-type transistor, the first electrode is a drain electrode and the second electrode is a source electrode. A third node of each transistor is a control electrode.

Figure 6A:
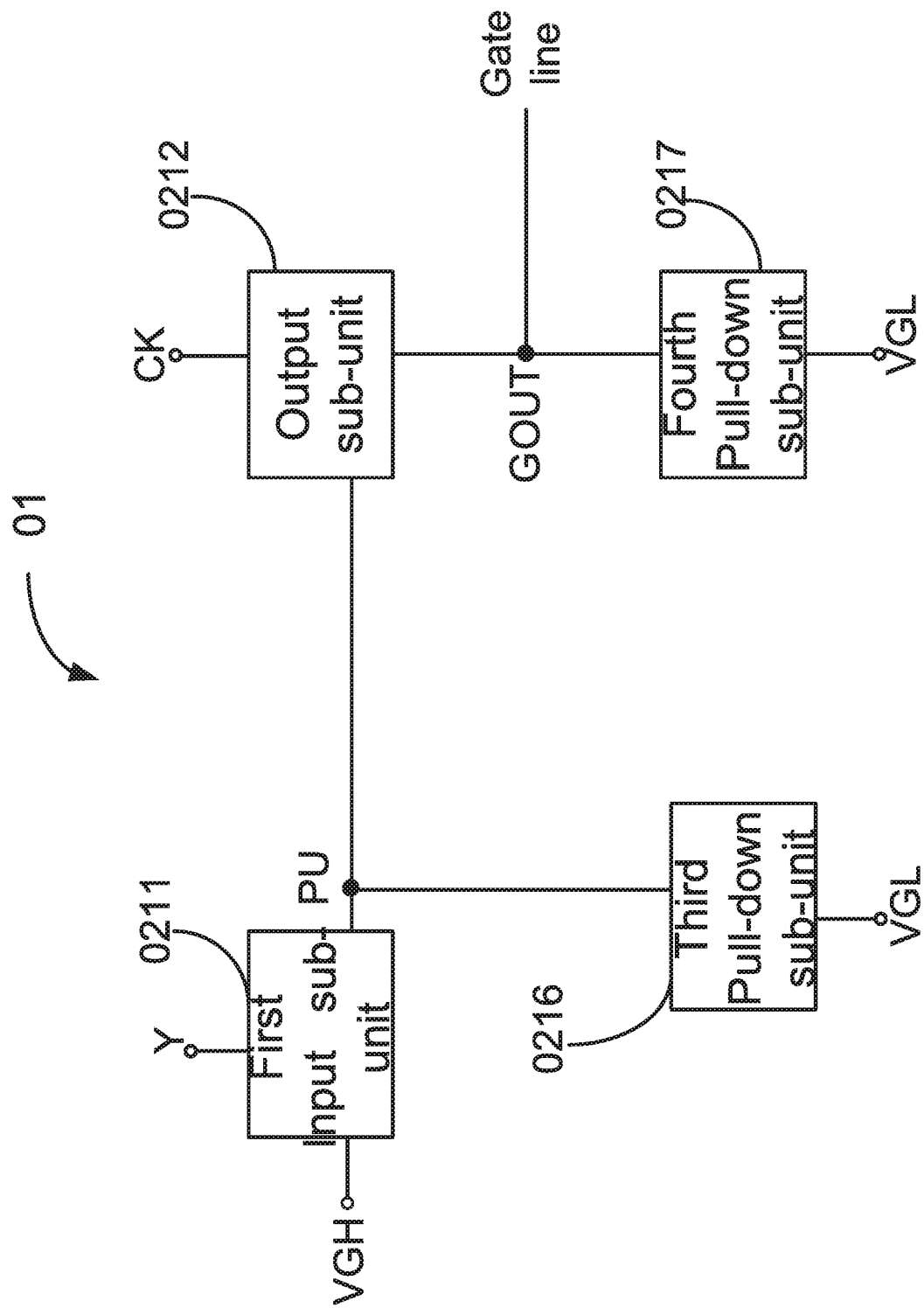
FIG. 6A is a simplified diagram of a first-GOA unit disposed upstream of a voltage transmitting GOA unit in some embodiments.

FIG. 6A is a simplified diagram of a first-GOA unit disposed upstream of a voltage transmitting GOA unit in some embodiments. Referring to FIG. 6A, the first-GOA unit 01 includes a first input sub-unit 0211, an output sub-unit 0212, a third pull-down sub-unit 0216, a fourth pull-down sub-unit 0217, and a control pull-down sub-unit 0218. In some embodiment, each second-GOA unit has a circuit structure substantially the same as that of the first-GOA unit (e.g., the one shown in FIG. 6A).

Referring to FIG. 6A, the first input sub-unit 0211 in each first-GOA unit 01 is connected respectively to a first signal port Y, a second signal port VGH, and a first node PU. The first input sub-unit 0211 is configured to control potential level at the first node PU under control of a first control signal from the first signal port Y and a second control signal from the second signal port VGH. The first signal port Y in the first-stage first-GOA unit 01 is a start-cycle signal port. In a cth-stage first-GOA unit 01, the first signal port Y is the output port of a previous (c−1)th-stage first-GOA unit 01.

Referring to FIG. 6A, the output sub-unit 0212 is connected respectively to a third signal port CK, the first node PU, and a gate node GOUT. The output sub-unit 0212 is configured to control potential level at the gate node GOUT under control of a third control signal from the third signal port CK and the potential level of the first node PU. Further, the third pull-down sub-unit 0216 is connected respectively to a fourth signal port VGL, a third node PD, and the first node PU. The third pull-down sub-unit 0216 is configured to control the potential level of the first node PU under control of a fourth control signal from the fourth signal port VGL and a potential level at the third node PD. Furthermore, the fourth pull-down sub-unit 0217 is connected respectively to the fourth signal port VGL, the third node PD, and the gate node GOUT. The fourth pull-down sub-unit 0217 is configured to control the potential level of the gate node GOUT under control of the fourth control signal from the fourth signal port VGL and the potential level at the third node PD. Moreover, the control pull-down sub-unit 0218 is connected to the third node PD and is configured to pass a voltage signal to the third node PD to set the potential level of the third node PD. The gate node GOUT is connected to a corresponding gate line associated with the first-GOA unit 01.

Figure 6B:
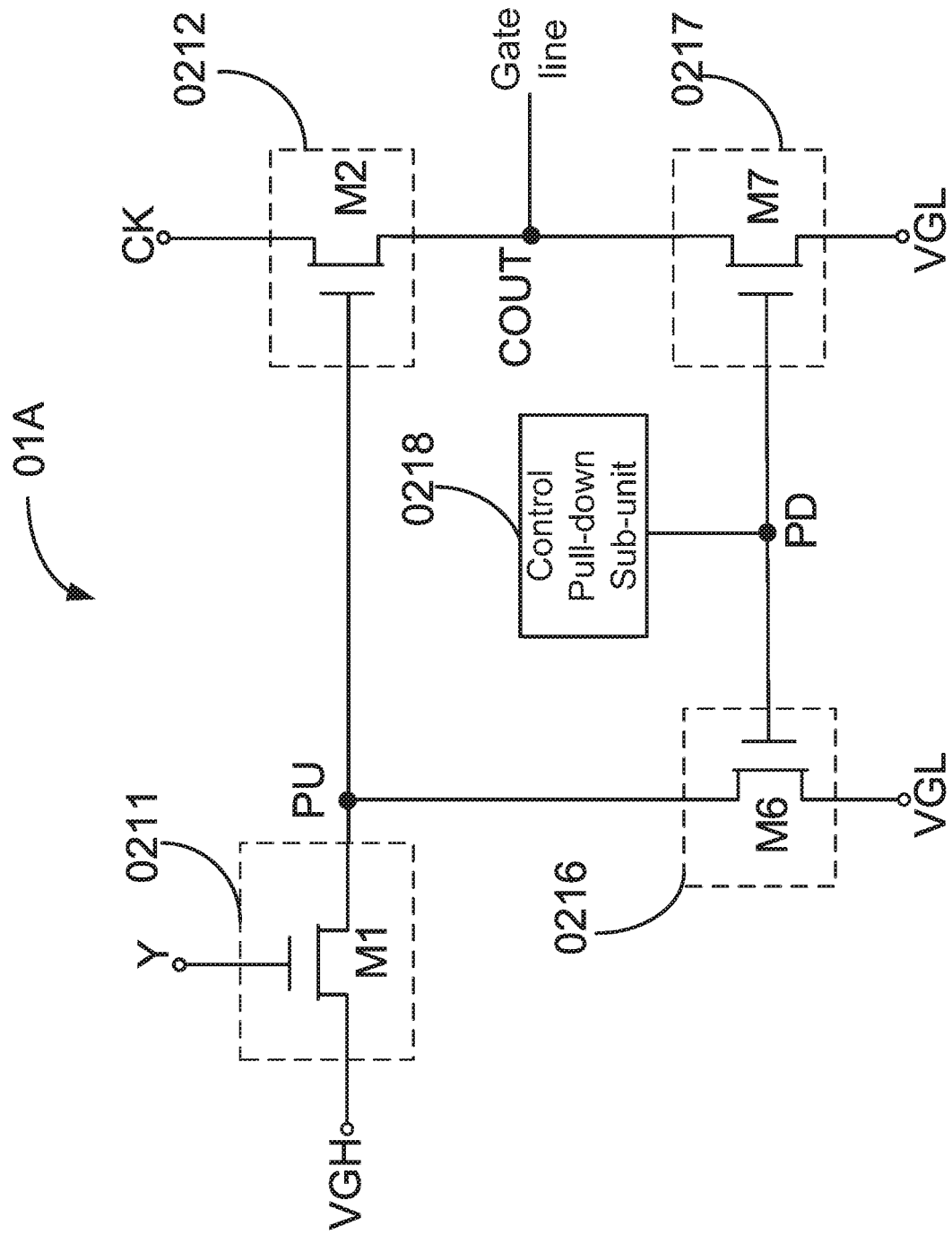
FIG. 6B is a simplified diagram of a first-GOA unit disposed upstream of a voltage transmitting GOA unit in some embodiments.

FIG. 6B is a simplified diagram of a first-GOA unit disposed upstream of a voltage transmitting GOA unit in some embodiments. Referring to FIG. 6B, the first input sub-unit 0211 includes a first transistor M1. The output sub-unit 0212 includes a second transistor M2. The third pull-down sub-unit 0216 includes a sixth transistor M6. The fourth pull-down sub-unit 0217 includes a seventh transistor M7. M1 has a first electrode connected to the second signal port VGH, a second electrode connected to the first node PU, and a control electrode connected to the first signal port Y. M2 has a first electrode connected to the third signal port CK, a second electrode connected to the gate node GOUT, and a control electrode connected to the first node PU. M6 has a first electrode connected to the fourth signal port VGL, a second electrode connected to the first node PU, and a control electrode connected to the third node PD. M7 has a first electrode connected to the fourth signal port VGL, a second electrode connected to the gate node GOUT, and a control electrode connected to the third node PD. Optionally, the second-GOA unit has a circuit structure substantially the same as that of the first-GOA unit (e.g., a first-GOA unit shown in FIG. 6A or FIG. 6B).

Figure 7A:
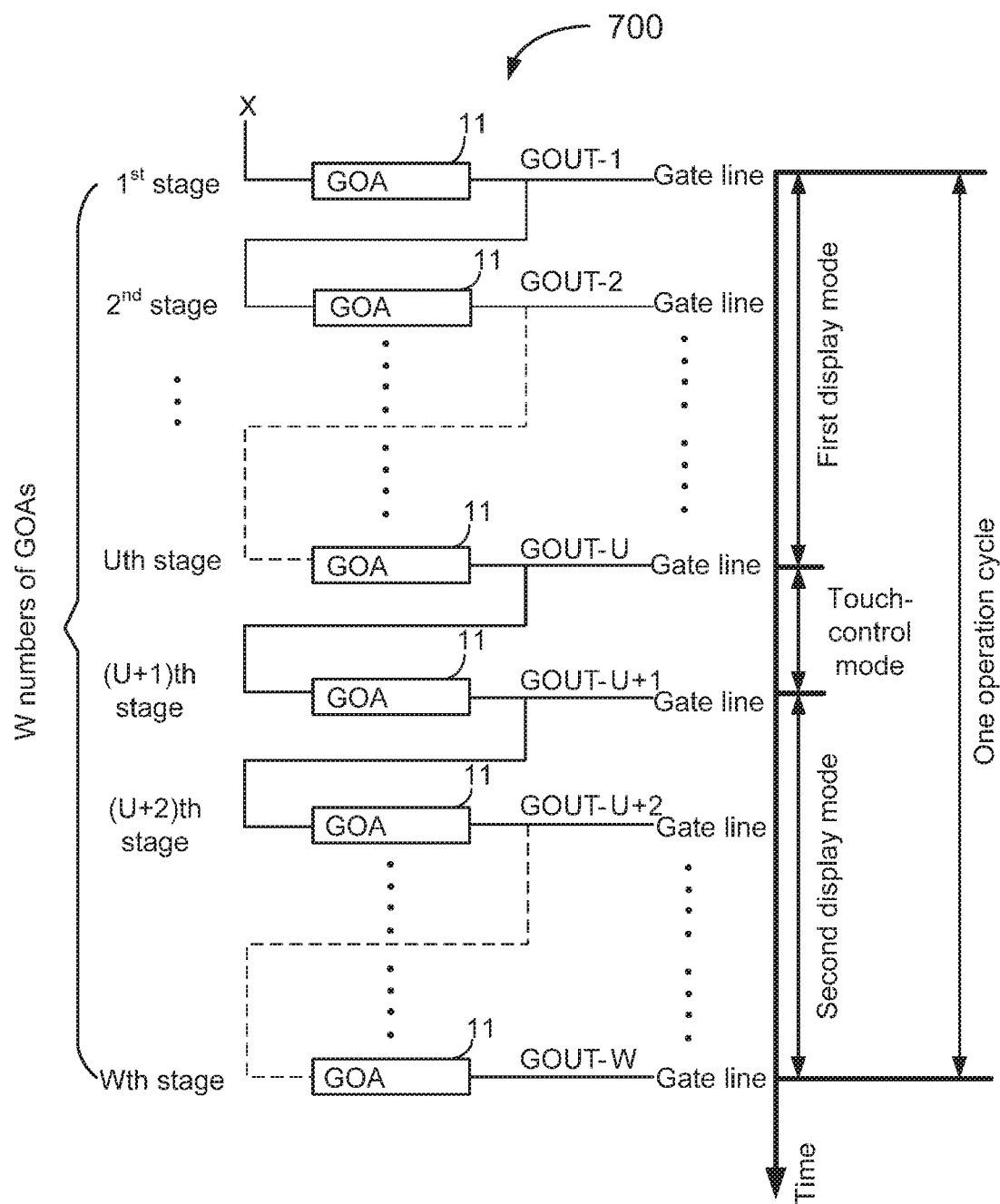
FIG. 7A is a simplified diagram of a conventional GOA circuit.

FIG. 7A is a simplified diagram of a conventional GOA circuit. Referring to FIG. 7A, such a GOA unit 700 includes W-stage cascaded GOA units 11. The first-stage GOA unit 11 has an input port connected to a start-cycle signal port X. Any-stage GOA unit 11 other than the first-stage GOA unit has an input port connected to an output port of a previous adjacent-stage GOA unit 11. Each output port of each stage GOA unit is also connected to a corresponding gate line.

Optionally, each GOA unit 11 has a circuit structure substantially the same as that of the first-GOA unit (e.g., a first-GOA unit shown in FIG. 6A or FIG. 6B). Each GOA unit 11 includes a first input sub-unit, an output sub-unit, a third pull-down sub-unit, a fourth pull-down sub-unit, and a control pull-down sub-unit. Each GOA unit 11 includes an output port which is the gate node GOUT connected to the corresponding gate line. The first-stage GOA unit has an output port (or gate node GOUT) marked as GOUT-1. The second-stage GOA unit has an output port marked as GOUT-2. The Uth-stage GOA unit has an output port marked as GOUT-U. The (U+1)th-stage GOA unit has an output port marked as GOUT-U+1. The Wth-stage GOA unit has an output port marked as GOUT-W.

Referring to FIG. 7A, during the display mode, the GOA circuit 700 is configured to input control signals to each stage GOA unit 11 for controlling each stage GOA unit 11 to provide or a gate driving signal to each corresponding gate line. At the beginning of a touch control mode between a first display mode and a second display mode, the GOA circuit 700 controls a Uth-stage GOA unit 11 to provide the gate driving to the corresponding gate line. At the end of the touch control mode, the GOA circuit 700 is to control a next (U+1)th-stage GOA unit 11 to provide a gate driving to the corresponding gate line.

Figure 7B:
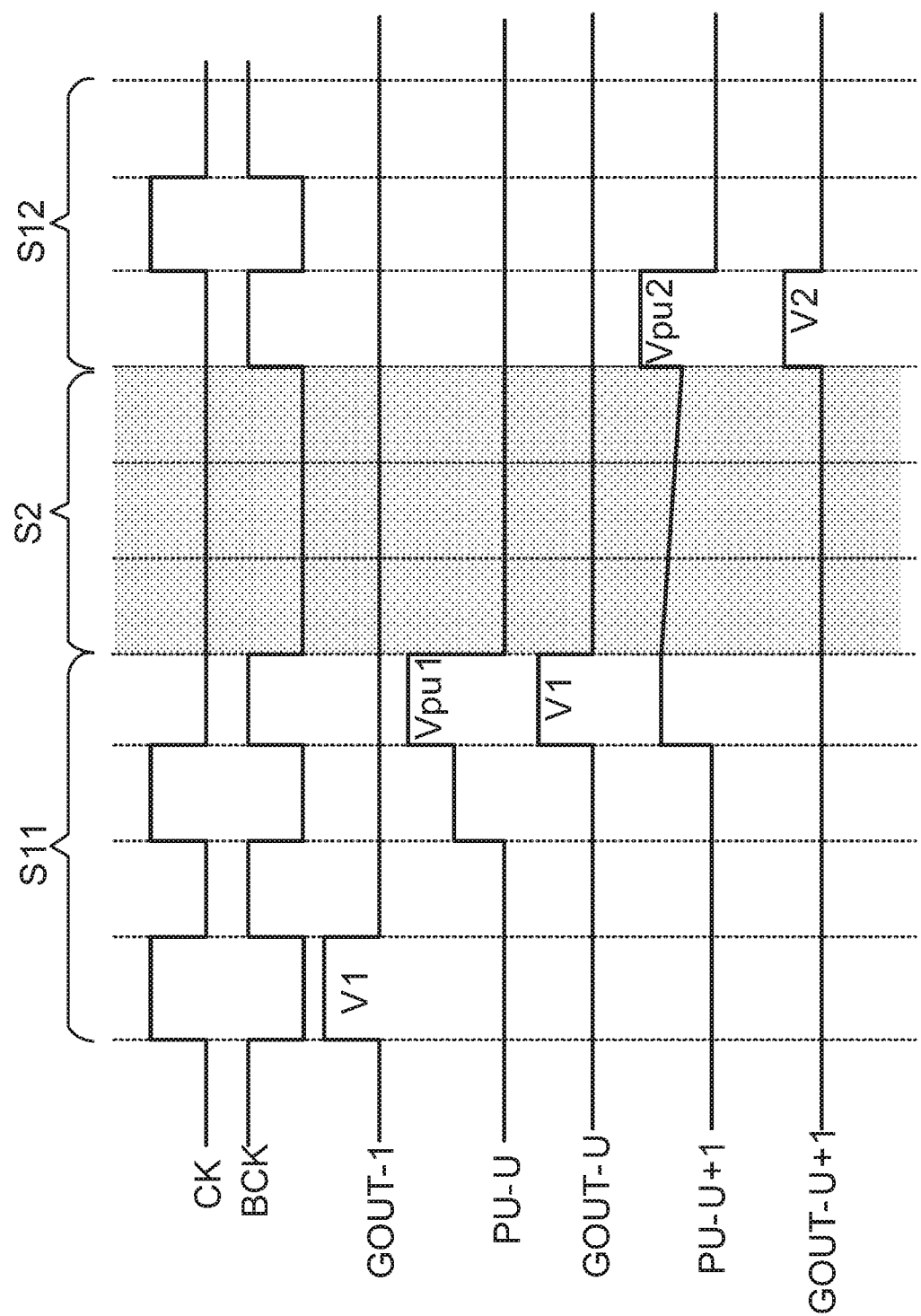
FIG. 7B is an operation timing diagram of a conventional GOA circuit.

FIG. 7B is an operation timing diagram of a conventional GOA circuit. Referring to FIG. 7B, the time-division mode includes a first display mode S11 and a second display mode S12. The touch control mode S2 is between the first display mode S11 and the second display mode S12. Specifically, the touch control mode S2 is a time period between an operation of a Uth-stage GOA unit for outputting a gate driving signal to a corresponding gate line and an operation of a next (U+1)th-stage GOA unit for outputting another gate driving signal to a corresponding gate line. At the starting moment of the first display mode S11, the gate node GOUT-1 of the first-stage GOA unit outputs a first voltage V1 to the corresponding gate line. When the first display mode S11 ends, the first node PU of the Uth-stage GOA unit has a potential level Vpu1. The gate node GOUT-U of the Uth-stage GOA unit also outputs the first voltage V1 to a corresponding gate line. The first voltage V1 is a normal gate driving signal.

After the Uth-stage GOA unit outputs the first voltage V1 to the gate line, the touch-control mode S2 starts. During the touch control mode S2, none of the GOA units outputs a gate driving signal to a gate line. Due to transistor leakage current, the first node PU of the GOA unit will decay over time in the touch control mode S2. Thus at the end of the touch control mode S2, the first node PU of the (U+1)th GOA unit has a reduced potential level Vpu2, lower than the potential level Vpu1 at the first node PU of previous Uth-stage GOA unit. The gate node GOUT-U+1 of the (U+1)th-stage GOA unit outputs a second voltage V2 to a corresponding gate line. V2 is smaller than normal gate driving signal V1, resulting in at least one line on the display panel having reduced brightness.

Figure 7C:
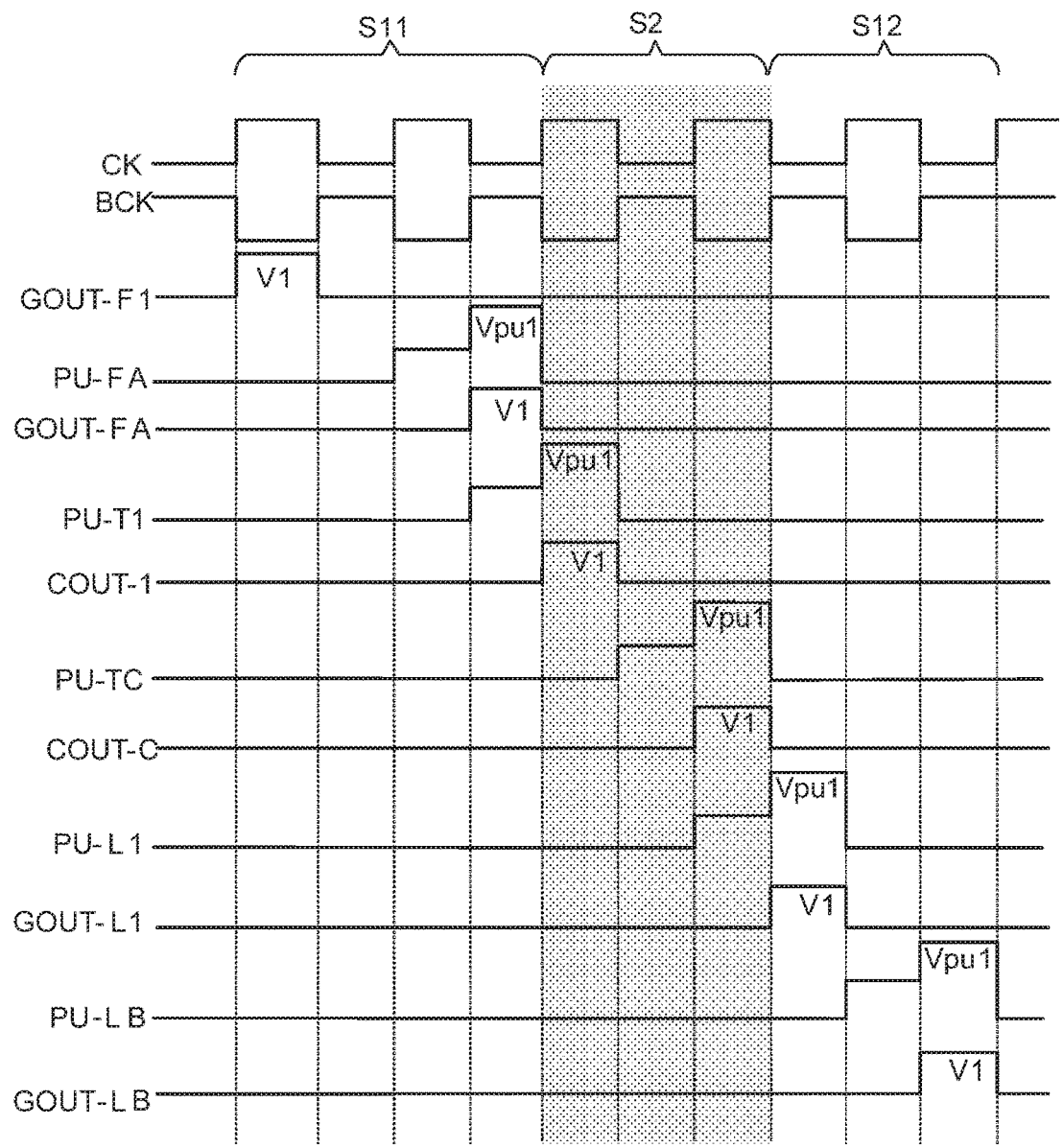
FIG. 7C is an operation timing diagram for a GOA circuit in some embodiments.

FIG. 7C is an operation timing diagram of a GOA circuit in some embodiments, e.g., the GOA circuit as shown in FIG. 1 and FIG. 2. Referring to FIG. 7C, the time-division mode includes a first display mode S1 and a second display mode S12. The touch control mode S2 is between the first display mode S11 and the second display mode S12. The voltage transmitting circuit is operated during the touch control mode S2 between an operation of a Ath-stage first-GOA unit for outputting a gate driving signal to a corresponding gate line and an operation of a first-stage second-GOA unit for outputting another gate driving signal to a corresponding gate line. At the starting moment of the first display mode S11, the gate node GOUT-F1 of the first-stage first-GOA unit outputs a first voltage V1 to the corresponding gate line. When the first display mode S11 ends, the first node PU of the Ath-stage first-GOA unit has a potential level Vpu1. The gate node GOUT-FA of the Ath-stage first-GOA unit also outputs the first voltage V1 to a corresponding gate line. The first voltage V1 is a normal gate driving signal.

After the Ath-stage first-GOA unit outputs the first voltage V1 to the corresponding gate line, the touch control mode S2 starts. The gate node GOUT-FA in the Ath-stage first-GOA unit is configured to output the first voltage V1 to the first-stage voltage transmitting GOA unit to maintain potential level at the first node PU-T1 of the first-stage voltage transmitting GOA unit substantially the same as that of the Vpu1. Thus, the second node COUT-1 of the first-stage voltage transmitting GOA unit passes the first voltage V1 as an input to the second-stage voltage transmitting GOA unit, and so on. The second node COUT-C−1 of the (C−1)th-stage voltage transmitting GOA unit is configured to output the first voltage V1 as an input to the Cth-stage voltage transmitting GOA unit to keep the first node PU-TC at substantially the same potential level as that of Vpu1.

Additionally, the second node COUT-C of the Cth-stage voltage transmitting GOA unit outputs the first voltage V1 to the first-stage second-GOA unit. The first node PU-L1 of the first-stage second-GOA unit is thus kept at the Vpu1. Further, the second node GOUT-L1 of the first-stage second-GOA unit passes the first voltage V1 as an input to the second-stage second-GOA unit, and so on. The second node GOUT-L(B−1) of the (B−1)th-stage second-GOA unit outputs the first voltage V1 to the Bth-stage second-GOA unit while the first node PU-LB in the Bth-stage second-GOA unit is maintained at the same potential level Vpu1. Therefore, during the touch control mode, through one or more stage of voltage transmitting GOA units, the output voltage of an Ath-stage first-GOA unit is transferred to the first-stage second-GOA unit at substantially the same level. This prevents the voltage level outputted to the gate line from dropping from V1 to V2 due to transistor leakage current in the Ath-stage first-GOA unit. The output voltage levels for each-stage first-GOA unit and each-stage second-GOA unit may be maintained at substantially the same level, e.g., the level of a normal gate driving signal V1. By having this design, the dark line in the display panel may be eliminated.

For operating a convention GOA circuit, in order to stop the GOA circuit during the touch control mode, a third control signal from the third signal port CK and a sixth control signal from the sixth signal port BCK are both set to low voltage level (to turn off corresponding control transistors). In the present GOA circuit, the voltage transmitting circuit is operating during the touch control mode, it is not necessary to control the third control signal and the sixth control signal at low voltage level. Instead, both the third control signal and the sixth control signal are allowed to provide normal signals. Optionally, each of the first-GOA unit, the voltage transmitting GOA unit, and the second-GOA unit can share a same third control signal (i.e., a clock signal) from the third signal port CK.

In some embodiments, each transistor in every voltage transmitting GOA unit is fabricated in a small size, so that the GOA circuit may be modified to accommodate the present voltage transmitting circuit without substantially changing overall dimension or layout of the GOA circuit. As a result, the overall dimension and layout of the modified GOA circuit are highly compatible with an active area of the corresponding display panel. In some embodiments, the circuitry structure of the voltage transmitting GOA unit can be any one of those as shown in FIG. 3A, FIG. 3B, FIG. 4A, FIG. 4B, FIG. 5A, and FIG. 5B. Numerous alternative circuitry structures may be used for making the present voltage transmitting GOA unit.

In the present GOA circuit, the input port of the present voltage transmitting circuit is connected to the output port of a Ath-stage first-GOA unit, and the output port of the voltage transmitting circuit is connected to the input port of a first-stage second-GOA unit. The voltage transmitting circuit does not connect to any gate line. The voltage transmitting circuit is operated to provide an output voltage at substantially the same level as that of an input voltage in the touch control mode. Therefore, the voltage transmitting circuit is capable of passing the high voltage level outputted from the Ath-stage first-GOA unit to the first-stage second-GOA unit, obviating the voltage level drop issue due to thin-film transistor leakage current. Thus, the output voltage at every-stage GOA unit may be kept at substantially the same level, e.g., a level for normal gate driving control, eliminating possible dark lines in the display panel By having this design, display quality in a display panel having the present GOA circuit may be significantly enhanced.

In anther aspect, the present disclosure provides a display panel. In some embodiments, the display panel includes a gate driver on array or GOA circuit, e.g., the GOA circuit 100 as shown in FIG. 1 or the GOA circuit 100A as shown in FIG. 2.

In a display panel having the present GOA circuit, the input port of the voltage transmitting circuit is connected to the output port of a Ath-stage first-GOA unit and an output port of the voltage transmitting circuit is connected to the input port of a first-stage second-GOA unit. The voltage transmitting circuit does not connect to any gate line. The voltage transmitting circuit is operated to provide an output voltage (to the first-stage second-GOA unit) that is substantially equal to an input voltage (received from the Ath-stage first-GOA unit) during a touch control mode. The touch control mode is a time period between two adjacent display modes. The voltage transmitting circuit is capable of passing the high voltage level outputted from the Ath-stage first-GOA unit to the first-stage second-GOA unit, obviating the voltage level drop issue due to thin-film transistor leakage current. Thus, the output voltage at every-stage GOA unit may be kept at substantially the same level, e.g., a level for normal gate driving control, eliminating possible dark lines in the display panel By having this design, display quality in a display panel having the present GOA circuit may be significantly enhanced.

In another aspect, the present disclosure provides a display apparatus having a display panel described herein. Examples of appropriate display apparatuses include, but are not limited to, an electronic paper, a mobile phone, a tablet computer, a television, a monitor, a notebook computer, a digital album, a GPS, etc.

In another aspect, the present disclosure provides a gate driving method in a display panel having a present GOA circuit. In some embodiments, the method includes forwarding the output voltage from the Ath-stage first-GOA unit to the first-stage second-GOA unit as an input voltage for the first-stage second-GOA unit. The output voltage from the Ath-stage first-GOA unit is maintained at substantially the same level during the forwarding step. Specifically, the method may include outputting the output voltage from the Ath-stage first-GOA unit to the input port of the voltage transmitting circuit; and outputting the forwarded voltage from the output port of the voltage transmitting circuit to the input port of the first-stage second-GOA. The output voltage from the Ath-stage first-GOA unit is substantially equal to the input voltage for the first-stage second-GOA unit.

In some embodiments, a display panel having the present GOA is operated in a time-division mode having at least a display mode and a touch control mode. Optionally, the time-division mode may include a touch control mode between display of two adjacent rows of gate lines, i.e., the time-division mode includes a touch control mode between two adjacent first and second display mode. During the first display mode, image is displayed in one or more rows of pixels. During the second display mode, image is display in one or more rows of pixels. The touch control mode is inserted between the first display mode and the second display model. During the touch control mode, the output voltage from the Ath-stage first-GOA unit is received by the voltage transmitting circuit at its input port, and is forwarded to the first-stage second-GOA unit as its input voltage. Optionally, the step of outputting the output voltage and the step of outputting the forwarded voltage are performed during the touch control mode between a first display mode and a second display mode.

In some embodiments, the method further includes providing a first gate driving signal from the Ath-stage first-GOA unit to a gate line corresponding to the Ath-stage first-GOA unit in the first display mode; and providing a second gate driving signal from the first-stage second-GOA unit to a gate line corresponding to the first-stage second-GOA unit in the second display mode. The first gate driving signal is substantially equal to the second driving signal.

Optionally, the gate line corresponding to the Ath-stage first-GOA unit and the gate line corresponding to the first-stage second-GOA unit are adjacent to each other in the display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A gate driver on array (GOA) circuit comprising:
   a first GOA circuit;
   a second GOA circuit; and
   a voltage transmitting circuit configured to transmit an output voltage from the first GOA circuit to the second GOA circuit as an input voltage for the second GOA circuit; the output voltage from the first GOA circuit and the input voltage for the second GOA circuit having a substantially the same voltage level;
   wherein an input port of the voltage transmitting circuit is connected to an output port of the first GOA circuit and configured to receive the output voltage from the first GOA circuit and an output port of the voltage transmitting circuit is connected to an input port of the second GOA circuit and configured to output a forwarded voltage to the second GOA circuit as the input voltage for the second GOA circuit;
   wherein the first GOA circuit comprises A stages of first-GOA-sub-circuits, A being a positive integer greater than or equal to 1; each of the A stages of first-GOA sub-circuits having an input port and an output port, the output port of each of the A stages of first-GOA sub-circuits being connected respectively to a gate line of a same stage and an input port of a next adjacent-stage first-GOA sub-circuit, the input port of a first-stage first-GOA sub-circuit being connected to a start-cycle signal port, the output port of an Ath-stage first-GOA sub-circuit being connected to a gate line of a same stage;
   the second GOA circuit comprises B stages of second-GOA-sub-circuits, B being a positive integer greater than or equal to 1; each of the B stages of second-GOA sub-circuits having an input port and an output port, the output port of each of the B stages of second-GOA sub-circuits being connected respectively to a gate line of a same stage and an input port of a next adjacent-stage second-GOA sub-circuit, the output port of a Bth-stage second-GOA sub-circuit being connected to a gate line of a same stage;
   the voltage transmitting circuit is configured to transmit an output voltage from the Ath-stage first-GOA sub-circuit to a first-stage second-GOA sub-circuit as an input voltage for the first-stage second-GOA sub-circuit; the output voltage from the Ath-stage first-GOA sub-circuit and the input voltage for the first-stage second-GOA sub-circuit having a substantially the same voltage level; the Ath-stage first GOA sub-circuit, the voltage transmitting circuit, and the first-stage second-GOA being cascaded in series;
   the input port of the voltage transmitting circuit is connected to an output port of the Ath-stage first-GOA sub-circuit and configured to receive the output voltage from the Ath-stage first-GOA sub-circuit; and the output port of the voltage transmitting circuit is connected to an input port of the first-stage second-GOA sub-circuit and configured to output a forwarded voltage to the first-stage second-GOA as the input voltage for the first-stage second-GOA sub-circuit, the output voltage from the Ath-stage first-GOA sub-circuit being substantially equal to the input voltage for the first-stage second-GOA sub-circuit; and
   when A is greater than 1, the A stages of first-GOA-sub-circuits cascaded from the first stage GOA sub-circuit to the Ath-stage first GOA sub-circuit; when B is greater than 1, the B stages of second-GOA-sub-circuits cascaded from the first-stage second-GOA sub-circuit to the Bth-stage second-GOA sub-circuit.

2. The GOA circuit of claim 1, wherein a gate line connected to the output port of the Ath-stage first GOA sub-circuit is adjacent to a gate line connected to an output port of the first stage second-GOA sub-circuit.

3. The GOA circuit of claim 1, wherein the voltage transmitting circuit is configured to receive the output voltage from the Ath-stage first-GOA sub-circuit and output the forwarded voltage to the first-stage second-GOA during a touch control phase in a display panel having the gate driver on array circuit.

4. The GOA circuit of claim 1, wherein the voltage transmitting circuit comprises:
C stages of voltage transmitting GOA sub-circuits, C being a positive integer greater than or equal to 1, each of the C stages of voltage transmitting GOA sub-circuits having an input port and an output port, the input port of a first-stage voltage transmitting GOA sub-circuit being the input port of the voltage transmitting circuit, the output port of each of the C stages of voltage transmitting GOA sub-circuits being connected to the input port of a next adjacent-stage voltage transmitting GOA sub-circuit, the output port of a Cth-stage voltage transmitting GOA sub-circuit being the output port of the voltage transmitting circuit;
when C is greater than 1, the C stages of voltage transmitting GOA sub-circuits cascaded from the first-stage voltage transmitting GOA sub-circuit to the Cth-stage voltage transmitting GOA sub-circuit.

5. The GOA circuit of claim 4, wherein any two adjacent-stage first-GOA sub-circuits have a first separation defined by two gate lines connected to the output ports of the two adjacent-stage first-GOA sub-circuits, any two adjacent-stage second-GOA sub-circuits have a second separation defined by two gate lines connected to the output ports of the two adjacent-stage second-GOA sub-circuits, the second separation being substantially equal to the first separation and equal to a separation between the Ath-stage first-GOA sub-circuit and the first-stage second-GOA sub-circuit.

6. The GOA circuit of claim 5, wherein each of the voltage transmitting GOA sub-circuits comprises a first input sub-unit, an output sub-unit, a first pull-down sub-unit, and a second pull-down sub-unit;
the first input sub-unit is connected to a first signal port, a second signal port, and a first node, and is configured to control potential level at the first node under control of a first control signal from the first signal port and a second control signal from the second signal port; the first signal port of the first-stage voltage transmitting GOA sub-circuit is the output port of the Ath-stage first-GOA sub-circuit, the first signal port of a voltage transmitting GOA sub-circuit other than the first-stage voltage transmitting GOA sub-circuit is the output port of a previous adjacent-stage voltage transmitting GOA sub-circuit;
the output sub-unit is connected to a third signal port, the first node, and a second node, and is configured to control potential level at the second node under control of a third control signal from the third signal port and the potential level at the first node;
the first pull-down sub-unit is connected to a fourth signal port, a fifth signal port, and the first node and is configured to control potential level at the first node under control of a fourth control signal from the fourth signal port and a fifth control signal from the fifth signal port; the fifth signal port of a voltage transmitting GOA sub-circuit other than the Cth-stage voltage transmitting GOA sub-circuit is the output port of a next adjacent-stage voltage transmitting GOA sub-circuit, the fifth signal port of the Cth-stage voltage transmitting GOA sub-circuit is the output port of the first-stage second-GOA sub-circuit;
the second pull-down sub-unit is connected to the fourth signal port, a sixth signal port, and the second node, and is configured to control the potential level at the second node under control of the fourth control signal from the fourth signal port and a sixth control signal from the sixth signal port; and
the input port of the voltage transmitting circuit is a terminal of the first input sub-unit of the first-stage voltage transmitting GOA sub-circuit connected to the first signal port, the output port of the voltage transmitting circuit is the second node of the Cth-stage voltage transmitting GOA sub-circuit.

7. The GOA circuit of claim 6, wherein the first input sub-unit comprises a first transistor, the output sub-unit comprises a second transistor, the first pull-down sub-unit comprises a third transistor, and the second pull-down sub-unit comprises a fourth transistor;
the first transistor comprises a first electrode connected to the second signal port, a second electrode connected to the first node, and a control electrode connected to the first signal port;
the second transistor comprises a first electrode connected to the third signal port, a second electrode connected to the second node, and a control electrode connected to the first node;
the third transistor comprises a first electrode connected to the fourth signal port, a second electrode connected to the first node, and a control electrode connected to the fifth signal port; and
the fourth transistor comprises a first electrode connected to the fourth signal port, a second electrode connected to the second node, and a control electrode connected to the sixth signal port.

8. The GOA circuit of claim 5, wherein each of the voltage transmitting GOA sub-circuits comprises a second input sub-unit, an output sub-unit, and a second pull-down sub-unit;
the second input sub-unit is connected to a first signal port, a sixth signal port, and a first node, and is configured to control potential level at the first node under control of a first control signal received from the first signal port and a sixth control signal received from the sixth signal port; the first signal port of the first-stage voltage transmitting GOA sub-circuit is the output port of the Ath-stage first-GOA sub-circuit, the first signal port of a voltage transmitting GOA sub-circuit other than the first-stage voltage transmitting GOA sub-circuit is the output port of a previous adjacent-stage voltage transmitting GOA sub-circuit;
the output sub-unit is connected to a third signal port, the first node, and a second node, and is configured to control potential level at the second node under control of a third control signal received from the third signal port and the potential level at the first node;
the second pull-down sub-unit is connected to a fourth signal port, a sixth signal port, and the second node, and is configured to control the potential level at the second node under control of a fourth control signal received from the fourth signal port and a sixth control signal received from the sixth signal port; and
the input port of the voltage transmitting circuit is a terminal of the second input sub-unit of the first-stage voltage transmitting GOA sub-circuit connected to the first signal port, the output port of the voltage transmitting circuit is the second node of the Cth-stage voltage transmitting GOA sub-circuit.

9. The GOA circuit of claim 8, wherein the second input sub-unit comprises a fifth transistor, the output sub-unit comprises a second transistor, and the second pull-down sub-unit comprises a fourth transistor;

the fifth transistor comprises a first electrode connected to the first signal port, a second electrode connected to the first node, and a control electrode connected to the sixth signal port;

the second transistor comprises a first electrode connected to the third signal port, a second electrode connected to the second node, and a control electrode connected to the first node; and the fourth transistor comprises a first electrode connected to the fourth signal port, a second electrode connected to the second node, and a control electrode connected to the sixth signal port.

10. The GOA circuit of claim 5, wherein each of the voltage transmitting GOA sub-circuits comprises a first input sub-unit, an output sub-unit, a third pull-down sub-unit, a fourth pull-down sub-unit, and a control pull-down sub-unit;

the first input sub-unit is connected to a first signal port, a second signal port, and a first node, and is configured to control potential level at the first node under control of a first control signal from the first signal port and a second control signal from the second signal port; the first signal port of the first-stage voltage transmitting GOA sub-circuit is the output port of the Ath-stage first-GOA sub-circuit, the first signal port of a voltage transmitting GOA sub-circuit other than the first-stage voltage transmitting GOA sub-circuit is the output port of a previous adjacent-stage voltage transmitting GOA sub-circuit;

the output sub-unit is connected to a third signal port, the first node, and a second node, and is configured to control potential level at the second node under control of a third control signal from the third signal port and the potential level at the first node;

the third pull-down sub-unit is connected to a fourth signal port, a third node, and the first node, and is configured to control the potential level at the first node under control of a fourth control signal from the fourth signal port and a potential level at the third node;

the fourth pull-down sub-unit is connected to the fourth signal port, the third node, and the second node, and is configured to control the potential level at the second node under control of the fourth control signal from the fourth signal port and the potential level at the third node;

the control pull-down sub-unit is connected to the third node for outputting a voltage to the third node to set the potential level at the third node; and the input port of the voltage transmitting circuit is a terminal of the first input sub-unit of the first-stage voltage transmitting GOA sub-circuit connected to the first signal port, the output port of the voltage transmitting circuit is the second node of the Cth-stage voltage transmitting GOA sub-circuit.

11. The GOA circuit of claim 10, wherein the first input sub-unit comprises a first transistor, the output sub-unit comprises a second transistor, the third pull-down sub-unit comprises a sixth transistor, the fourth pull-down sub-unit comprises a seventh transistor;

the first transistor comprises a first electrode connected to the second signal port, a second electrode connected to the first node, and a control electrode connected to the first signal port;

the second transistor comprises a first electrode connected to the third signal port, a second electrode connected to the second node, and a control electrode connected to the first node;

the sixth transistor comprises a first electrode connected to the fourth signal port, a second electrode connected to the first node, and a control electrode connected to the third node; and the seventh transistor comprises a first electrode connected to the fourth signal port, a second electrode connected to the second node, and a control electrode connected to the third node.

12. The GOA circuit of claim 5, wherein each of the first-GOA sub-circuits comprises: a first input sub-unit, an output sub-unit, a third pull-down sub-unit, a fourth pull-down sub-unit, and a control pull-down sub-unit, the first input sub-unit is connected to a first signal port, a second signal port, and a first node, and is configured to control potential level at the first node under control of a first control signal from the first signal port and a second control signal from the second signal port, the first signal port of the first-stage first-GOA sub-circuit is the start-cycle signal port, the first signal port of a first-GOA sub-circuit other than the first-stage first-GOA sub-circuit is the output port of a previous adjacent-stage first-GOA sub-circuit;

the output sub-unit is connected to a third signal port, the first node, and a gate node connected to a gate line of a same stage, and is configured to control potential level at the gate node under control of a third control signal from the third signal port and the potential level at the first node;

the third pull-down sub-unit is connected to a fourth signal port, a third node, and the first node, and is configured to control the potential level at the first node under control of a fourth control signal from the fourth signal port and potential level at the third node;

the fourth pull-down sub-unit is connected to the fourth signal port, the third node, and the gate node, and is configured to control the potential level at the gate node under control of the fourth control signal and the potential level at the third node; and the control pull-down sub-unit is connected to the third node for outputting a voltage to the third node to set the potential level at the third node.

13. The GOA circuit of claim 12, wherein the first input sub-unit comprises a first transistor, the output sub-unit comprises a second transistor, the third pull-down sub-unit comprises a sixth transistor, and the fourth pull-down sub-unit comprises a seventh transistor;

the first transistor comprises a first electrode connected to the second signal port, a second electrode connected to the first node, and a control electrode connected to the first signal port;

the second transistor comprises a first electrode connected to the third signal port, a second electrode connected to the gate node, and a control electrode connected to the first node;

the sixth transistor comprises a first electrode connected to the fourth signal port, a second electrode connected to the first node, and a control electrode connected to the third node; and the seventh transistor comprises a first electrode connected to the fourth signal port, a second electrode connected to the gate node, and a control electrode connected to the third node.

14. A display panel comprising a gate driver on array (GOA) circuit of claim 1.

15. The display panel of claim 14, wherein the display panel is operated in a time-division driving mode comprising a display mode and a touch control mode; the voltage transmitting circuit is configured to receive the output voltage and output the forwarded voltage to the first-stage second-GOA during the touch control mode.

16. A gate driving method in the for driving a display panel;
wherein the display panel comprises a gate driving on array (GOA) circuit;
wherein the GOA circuit comprises:
a first GOA circuit;
a second GOA circuit; and
a voltage transmitting circuit configured to transmit an output voltage from the first GOA circuit to the second GOA circuit as an input voltage for the second GOA circuit the output voltage from the first GOA circuit and the input voltage for the second GOA circuit having a substantially the same voltage level;
wherein an input port of the voltage transmitting circuit is connected to an output port of the first GOA circuit and configured to receive the output voltage from the first GOA circuit and an output port of the voltage transmitting circuit is connected to an input port of the second GOA circuit and configured to output a forwarded voltage to the second GOA circuit as the input voltage for the second GOA circuit;
wherein the first GOA circuit comprises A stages of first-GOA-sub-circuits, A being a positive integer greater than or equal to 1; each of the A stages of first-GOA sub-circuits having an input port and an output port, the output port of each of the A stages of first-GOA sub-circuits being connected respectively to a gate line of a same stage and an input port of a next adjacent-stage first-GOA sub-circuit, the input port of a first-stage first-GOA sub-circuit being connected to a start-cycle signal port, the output port of an Ath-stage first-GOA sub-circuit being connected to a gate line of a same stage;
the second GOA circuit comprises B stages of second-GOA-sub-circuits, B being a positive integer greater than or equal to 1; each of the B stages of second-GOA sub-circuits having an input port and an output port, the output port of each of the B stages of second-GOA sub-circuits being connected respectively to a gate line of a same stage and an input port of a next adjacent-stage second-GOA sub-circuit, the output port of a Bth-stage second-GOA sub-circuit being connected to a gate line of a same stage;
the voltage transmitting circuit is configured to transmit an output voltage from the Ath-stage first-GOA sub-circuit to a first-stage second-GOA sub-circuit as an input voltage for the first-stage second-GOA sub-circuit the output voltage from the Ath-stage first-GOA sub-circuit and the input voltage for the first-stage second-GOA sub-circuit having a substantially the same voltage level; the Ath-stage first GOA sub-circuit, the voltage transmitting circuit, and the first-stage second-GOA being cascaded in series;
the input port of the voltage transmitting circuit is connected to an output port of the Ath-stage first-GOA sub-circuit and configured to receive the output voltage from the Ath-stage first-GOA sub-circuit and the output port of the voltage transmitting circuit is connected to an input port of the first-stage second-GOA sub-circuit and configured to output a forwarded voltage to the first-stage second-GOA as the input voltage for the first-stage second-GOA sub-circuit, the output voltage from the Ath-stage first-GOA sub-circuit being substantially equal to the input voltage for the first-stage second-GOA sub-circuit; and
when A is greater than 1, the A stages of first-GOA-sub-circuits cascaded from the first stage GOA sub-circuit to the Ath-stage first GOA sub-circuit when B is greater than 1, the B stages of second-GOA-sub-circuits cascaded from the first-stage second-GOA sub-circuit to the Bth-stage second-GOA sub-circuit;
wherein the gate driving method comprises:
outputting the output voltage from the Ath-stage first-GOA sub-circuit to the input port of the voltage transmitting circuit; and
outputting the forwarded voltage from the output port of the voltage transmitting circuit to the input port of the first-stage second-GOA sub-circuit as the input voltage for the first-stage second-GOA sub-circuit;
wherein the output voltage is substantially equal to the input voltage.

17. The method of claim 16, wherein the display panel is operated in a time-division driving mode comprising a display mode and a touch control mode; outputting the output voltage and the step of outputting the forwarded voltage are performed during the touch control mode between a first display mode and a second display mode.

18. The method of claim 17, the method further comprising:
providing a first gate driving signal from the Ath-stage first-GOA sub-circuit to a gate line connected to the output port of the Ath-stage first-GOA sub-circuit in the first display mode; and
providing a second gate driving signal from the first-stage second-GOA sub-circuit to a gate line connected to the output port of the first-stage second-GOA sub-circuit in the second display mode;
wherein the first gate driving signal is substantially equal to the second driving signal.

19. The method of claim 18, wherein the gate line connected to the output port of the Ath-stage first-GOA sub-circuit and the gate line connected to the output port of the first-stage second-GOA sub-circuit are adjacent to each other in the display panel.

20. A display apparatus comprising a display panel of claim 14.

* * * * *